US005513215A

United States Patent [19]

Marchetto et al.

[11] Patent Number: 5,513,215

[45] Date of Patent: Apr. 30, 1996

[54] HIGH SPEED SIMULCAST DATA SYSTEM USING ADAPTIVE COMPENSATION

[75] Inventors: Robert F. Marchetto, Burnaby; Todd A. Stewart, West Vancouver; Paul K. Ho, Surrey, all of Canada

[73] Assignee: Glenayre Electronics, Inc., Charlotte, N.C.

[21] Appl. No.: 124,155

[22] Filed: Sep. 20, 1993

[51] Int. Cl.[6] .................. H03H 7/30; H04B 1/00

[52] U.S. Cl. .................. 375/233; 375/341; 375/348; 375/229; 455/51.2

[58] Field of Search .................. 375/284, 229, 375/230, 231, 232, 324, 346, 224, 348, 233, 285, 340, 341, 346, 348; 455/51.1, 51.2, 52.1, 65

[56] References Cited

U.S. PATENT DOCUMENTS

| | | | |
|---|---|---|---|
| 4,597,088 | 6/1986 | Posti et al. | 375/12 |
| 4,815,141 | 3/1989 | Carver et al. | 381/94 |
| 4,985,902 | 1/1991 | Gurcan | 375/232 |
| 5,054,113 | 10/1991 | Jasinski | 455/51.1 |
| 5,097,482 | 3/1992 | Serizawa et al. | 375/12 |
| 5,133,081 | 7/1992 | Mayo | 455/66 |
| 5,274,670 | 12/1993 | Serizawa et al. | 375/13 |
| 5,283,811 | 2/1994 | Chennakeshu | 375/232 |
| 5,285,480 | 2/1994 | Chennakeshu | 375/346 |
| 5,293,401 | 3/1994 | Serfaty | 375/231 |
| 5,335,250 | 8/1994 | Dent et al. | 375/224 |
| 5,353,307 | 10/1994 | Lester et al. | 375/14 |

*Primary Examiner*—Edward L. Coles, Sr.
*Assistant Examiner*—Madeleine AV Nguyen
*Attorney, Agent, or Firm*—Christensen O'Connor Johnson & Kindness

[57] ABSTRACT

In a simulcast communication system, a method and apparatus for compensating differences in propagation time, lack of synchronization in transmitters, and multipath fading to recover data transmitted to a receiving device. In a simulcast communication system(26) that comprises a plurality of transmitters (32), a receiver (36) includes a digital signal processor (DSP) (86) that processes a demodulated received signal to adaptively compensate for changes in the channel through which a multipath signal is propagated from the transmitters to the receiver. In one embodiment, the DSP comprises a decision feedback equalizer. An error signal is produced by the equalizer through a comparison of the estimated symbols with symbols most likely transmitted, for use in updating filter coefficients used by the equalizer in processing the received signal. Alternatively, in a linear adaptive equalizer, reference or pilot symbols transmitted with the data symbols are used to determine the error signal. Another embodiment implements a Viterbi algorithm to make decisions of the most likely data symbols in response to estimates of the channel impulse response. Further, a hybrid embodiment combines the Viterbi decoder with a bi-directional decision feedback equalizer that produces forward and reverse estimates of the sequence of data symbols. The Viterbi decoder selects between the forward and reverse sequences based upon channel impulse response estimates to dynamically compensate for varying channel conditions. Using any one of these embodiments, a linear modulated signal can be decoded to recover the data transmitted, even though the received signal has been degraded by propagation in a multipath fading channel. The same techniques are also disclosed as applicable to constant envelope modulated transmissions in a simulcast system.

15 Claims, 19 Drawing Sheets

HIGH SPEED SIMULCAST DATA SYSTEM USING ADAPTIVE COMPENSATION

FIELD OF THE INVENTION

This invention generally relates to a simulcast communication system, and more specifically, to a simulcast communication system in which data are transmitted to a receiver that compensates for errors caused by differences in the propagation time, synchronization of the transmitters, multipath Fading, and dynamically changing channel conditions affecting the received signal.

BACKGROUND OF THE INVENTION

In a simulcast paging or messaging system, data from a paging terminal are distributed to a plurality of transmitters for transmission to a receiving device that may be located anywhere within a relatively large service area of the system. Since the signal transmitted by each transmitter covers only a limited portion of the total service area, it is very possible that any of the receiving devices carried by users of the service will be located in overlap regions where the signals from two or more transmitters are received.

Conventional simulcast systems typically use two level frequency shift keying (FSK) to modulate the data transmitted by the plurality of transmitters. The paging/messaging simulcast systems in commercial use conform to one of the following standards: (1) the 512 baud (symbols/sec.) standard of the Post Office Code Standardization Advisory Group (POCSAG) also known as the CCIR Radiopaging Code No. 1 (RPC1); (2) the 600 baud Golay standard; (3) the 1200 baud POCSAG standard; or (4) the 2400 baud POCSAG. All of these systems use a 25 KHz channel and have a maximum efficiency of 2400/25000=0.096 bits/sec/Hz.

In a simulcast system using FSK modulation, differences in the propagation time for the signals from different transmitters reaching a receiving device located in an overlap region can cause degradation in the signal, which will increase the bit error rate (BER), because the sum of the signals from the different transmitters confuses the frequency discriminator or demodulator in the receiving device.

If the two RF signals have approximately equal power, which is a reasonable presumption for a receiving device in the overlap region, the resultant demodulated data bits are corrupted when the transmitted signals change from one frequency to another. The time during which the frequency of one transmitted signal overlaps with a different frequency from the other transmitted signal represents a random noisy portion of the received signal that causes a higher than desired BER, particularly, if the delay or difference in the propagation time of the different transmitted signals at the receiving device is greater than ¼ of a baud duration. Noticeable improvement in the operation of a conventional simulcast paging system results if the delay times between transmissions at the receiving device are less than ¼ of a baud. A typical maximum propagation time difference for signals from two adjacent transmitters in a simulcast system to reach a receiving device in the overlap region of the transmitters is about 54 μsec. This delay occurs when the receiving device is 10 miles closer to one of the two transmitters than the other.

Another source of RF signal delay in a simulcast system is caused by differences in the time that the data to be transmitted reaches each of the transmitters from the central paging terminal. These timing errors can readily be controlled at the transmitters or at the paging terminal to equalize the time for the signal from the paging terminal to reach the transmitters, to within approximately ±10 μsec. Thus, for two transmitters, the worst case delay of this type is 20 μsec., including a contribution of 10 μsec. from each of the transmitters. In this typical example, the worst case total delay time, including the time delay due to lack of synchronization between the signals transmitted from two adjacent transmitters and the delay caused by differences in the time for the two signals to reach a receiving device on the edge of the overlap region between the two transmitters is thus 20+54=74 μsec.

If the limit of acceptable delay is ¼ baud, the minimum baud duration, T, is simply 4×74=296 μsec., and the maximum baud rate for a conventional simulcast system is 1/T=1/296 μsec.=3378 baud (symbols per second). Conservatively, the maximum baud rate of a simulcast system is generally limited to about 3000 baud by this requirement to limit the effects of delay on the combined signals received from plural transmitters in a simulcast system.

Other sources of degradation that can adversely affect a simulcast signal include the Raleigh fading that often occurs when the receiver is moving, e.g., when the receiver is in a moving vehicle. Errors in the received signal can also arise due to slight differences in the transmission frequencies of simulcast base stations that are supposed to be transmitting nominally identical signals to a receiver. These differences in frequency cause distortion that can degrade the quality with which the transmitted RF signal is received. Each of these different sources of error can thus degrade the "quality" of the received signal. As used herein, the term "quality of the received signal" is intended to encompass degradations caused by: (a) different delays affecting multiple received signals; (b) relative differences in the carrier frequency of multiple transmitters; (c) Raleigh fading rate and fading characteristics; (d) relative differences in signal gain and phase between the signals received from multiple transmitters; and (e) noise level or signal-to-noise ratio (SNR). The term of art used herein to represent or define the quality of a received signal (except for degradation in the received signal caused by noise) is "channel impulse response" (CIR).

Recently, an improved simulcast data rate and modulation standard was proposed by the European Radio Message System (ERMES). This standard is a 4-level FSK scheme having a baud rate of 3125 and providing a data rate of 6250 bits/sec.—only slightly better than the baud rate limitation of more conventional simulcast systems. Another system, which was proposed by the Telocater committee, also has a data rate of 6250 bits/sec. and is a variation of the ERMES system. This system will likely be introduced into commercial use in North America in about one year. For the 6250 bits/sec. data rate, the efficiency is limited to 0.25 bits/sec./Hz. Both of these four-level FSK systems, as well as the more conventional two-level FSK system now in use, belong to a class of modulation referred to as constant envelope modulation.

The Federal Communications Commission (FCC) has solicited proposals for communications systems that might increase the efficiency of the RF spectrum utilization. In response, paging and messaging companies have submitted proposals for advanced systems to substantially increase the data rate of communication systems over current contemplated standards, including those noted above. Of the proposals submitted, one by Mobile Telecommunications Technologies (MTEL), consisting of two documents entitled, "PETITION FOR RULEMAKING," Nov. 13, 1991 and "REQUEST FOR PIONEER'S PREFERENCE," Nov. 12, 1991, described a modulation of 8 tone on-off keying (a 256 level scheme) with a baud rate of 3000. This scheme has a data rate of 24,000 bits/sec. on a 50 KHz channel; its efficiency is thus 24000/50000=0.48 bits/sec./Hz—twice that of the ERMES standard and the highest efficiency of a simulcast system in the prior art, but still relatively low.

Accordingly, it will be apparent that further improvements in the baud rate of simulcast communications are desirable. A simulcast communications system that overcomes the apparent limitation imposed by the ¼ baud delay that can occur in the synchronization and propagation times of simulcast transmissions is required. The improvement should be accomplished by using techniques that do not simply increase the number of levels of modulation.

SUMMARY OF THE INVENTION

In accordance with the present invention, a simulcast communication system for transferring data from a plurality of base stations to a receiving device comprises a plurality of transmitters disposed at the base stations. Each transmitter is provided with substantially identical data for transmission to a receiving device at substantially the same time and includes linear modulation means for linearly modulating a phase and an amplitude of a transmitted signal intended to be received by the receiving device, as a function of the data to be transferred. The receiving device includes linear demodulation means for demodulating a received signal to produce a demodulated signal as a function of a phase and an amplitude of the received signal. At times, the received signal corresponds to a sum of transmitted signals from at least two of the transmitters, as received by the receiving device, subject to differences in a propagation time between the two transmitters. In addition, the receiving device comprises compensation means for compensating the received signal so as to mitigate the effects of a dynamically changing impulse response of a multiple path fading channel. The impulse response is determinative of a quality of the received signal. The compensation means comprise means for compensating at least one of a plurality of sources of distortion affecting the received signal. The sources of distortion include: multipath; propagation fading; differences in propagation times for the transmitted signals from at least two of the transmitters to reach the receiving device; motion of the receiving device; differences in the frequency of the transmitted signals; and a lack of synchronization between the plurality of transmitters in transmitting the transmitted signals. The means for compensating enable the data that were transmitted to be recovered from the received signal even when the received signal is affected by these sources of distortion.

Preferably, in one form of the invention, the compensation means comprise an adaptive equalizer. The adaptive equalizer includes decision feedback means for determining an error in the received signal, and as a function of that error, adaptively and dynamically correcting the received signal to minimize the error in order to permit recovery of the data transmitted.

The adaptive equalizer means of one embodiment comprise processor means, decision means, and error determination means. The processor means adaptively process the demodulated signal as a function of a plurality of equalization coefficients, producing a processed signal. The decision means, coupled to the processor means to receive the processed signal, produces an estimated version of the data symbols that were transmitted. The error determination means, which are coupled to the processor means in receipt of the processed signal and to the decision means in receipt of the signal indicative of the data symbols, determine an error signal as a function of a difference between the data symbols indicated by the signal and the processed signal. The processor means include means for updating the plurality of equalization coefficients as a function of the error signal to substantially eliminate differences between the data symbols that were transmitted and those in the processed signal.

In another form of the invention, the transmitted signal from each transmitter includes a plurality of blocks of predefined reference symbols that are interspersed with the data transmitted. Each block of reference symbols includes at least one reference symbol. The adaptive equalizer comprises processor means that adaptively process the demodulated signal to separate the blocks from the data received and to adaptively and dynamically compensate the degradation in the received signal as a function of differences between the reference symbols that are received and the predefined reference symbols that were transmitted by the plurality of transmitters.

Where the signal transmitted comprises a plurality of symbols that represent the data to be transmitted, the compensation means in the receiving device comprise means for estimating the CIR of the channel and means for determining a sequence of the most likely symbols transmitted as a function of the estimated CIR. Preferably, the means for determining the sequence of most likely symbols transmitted comprise a decision feedback equalizer using equalizer coefficients that are determined by the estimated CIR. In one preferred form of the invention, the decision feedback equalizer is bi-directional, having tentative output demodulated data symbol sequences, and includes decision means for dynamically selecting the most likely symbol transmitted, for successive symbols, from one of the two sequences. The decision means comprise a Viterbi decoder. Alternatively, the decision means comprise a reduced complexity sequence estimator that uses a subset of all possible symbols to determine each of the most likely symbols in the sequence.

In one form of the invention, the plurality of transmitters include modulation means for modulating the data with a constant envelope to produce the transmitted signal directed to the receiving device.

Another aspect of the invention is directed to apparatus for use in a radio receiver to process a demodulated signal conveying symbols, to recover data that was transmitted. The apparatus includes a first stage equalizer that has an input coupled to the demodulated signal and two outputs and processes the demodulated signal to produce forward and reverse equalized signals. One of the two outputs provides the forward equalized output signal and the other provides the reverse equalized output signal. A channel estimator is included that has an input coupled to the demodulated signal and an output that provides a CIR estimate determined as a function of the symbols comprising the demodulated signal. Also included is a second stage equalizer having inputs coupled to the outputs of the first stage equalizer and to the output of the channel estimator, and an output for providing decoded data. The second stage equalizer selects between the forward and reverse equalized output signals as a function of the CIR estimates, and selects one of the forward and reverse equalized signals, for each successive symbol, to produce a decoded data signal.

As another aspect of the invention, in a simulcast communication system, a method is defined for transferring data to a receiving device. The method generally includes steps that are consistent with the functions implemented by the elements of the simulcast communication system discussed above. Corresponding methods are disclosed for each aspect of the communication system already discussed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Overview of a Simulcast Communication System

Figure 1A:
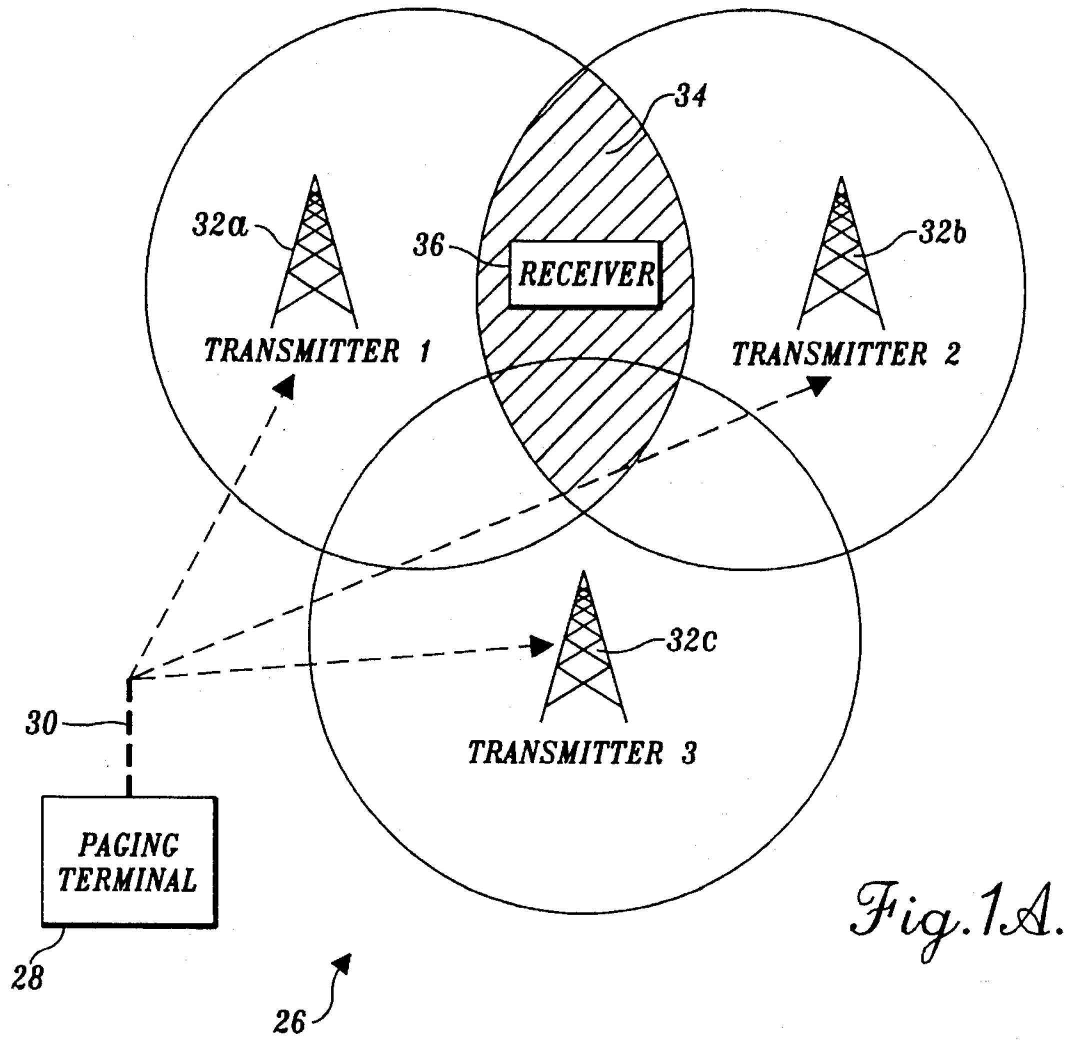
FIG. 1A is a schematic diagram of a simulcast communication system.

FIG. 1A illustrates a simulcast communication system 26 in which the present invention can be used to minimize degradation caused by multipath propagation of transmitted signals and to improve the baud rate with which data are conveyed between a plurality of transmitters 32 and a receiver 36. Simulcast communication system 26 includes a paging terminal 28 that transmits paging data to transmitters 32 over a radio frequency (RF) link 30 (or alternatively, over a telephone link). Transmitters 32 are disposed at geographically separated base stations of the simulcast communication system, with at least one transmitter at each base station. Each of the plurality of transmitters uses the same paging data to modulate a transmitted RF signal that covers a propagation zone of limited extent, as indicated by each of the circles around the transmitters shown in FIG. 1A. The problems caused by distortion due to propagation signal delay and synchronization differences between the transmitters in such a system are perhaps more easily understood by first considering a conventional simulcast communication receiver in an ideal case where such distortion is absent.

Figure 2:
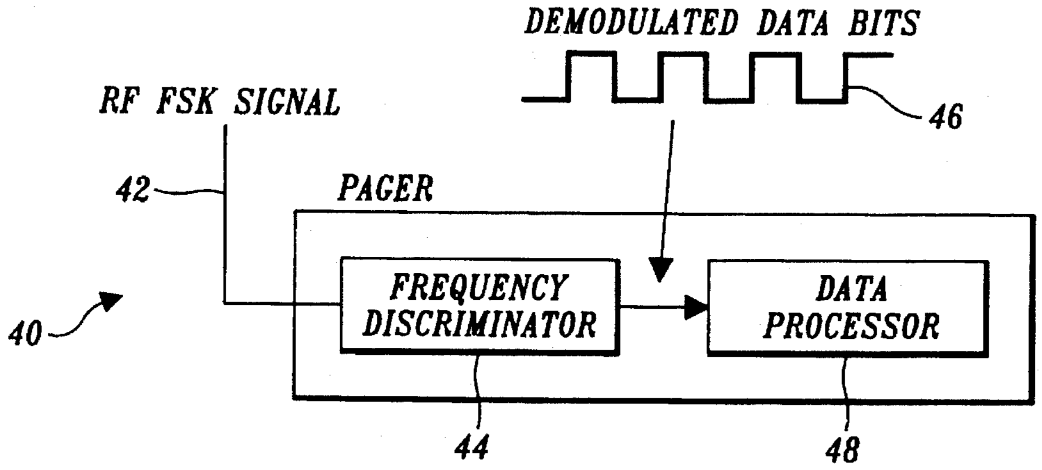
Fig.2. PRIOR ART
FIG. 2 is a block diagram of a prior art receiving device used in a simulcast communication system.

In FIG. 2, a prior art receiving device 40 is illustrated. Responding to a two-level frequency shift keying (FSK) modulated RF signal received over an antenna 42, a frequency discriminator 44 in the prior art receiver produces a demodulated data bit signal 46 in which non-return-to-zero (NRZ) data are delineated. A data processor 48 processes the demodulated NRZ data to recover the data transmitted.

Figure 3:
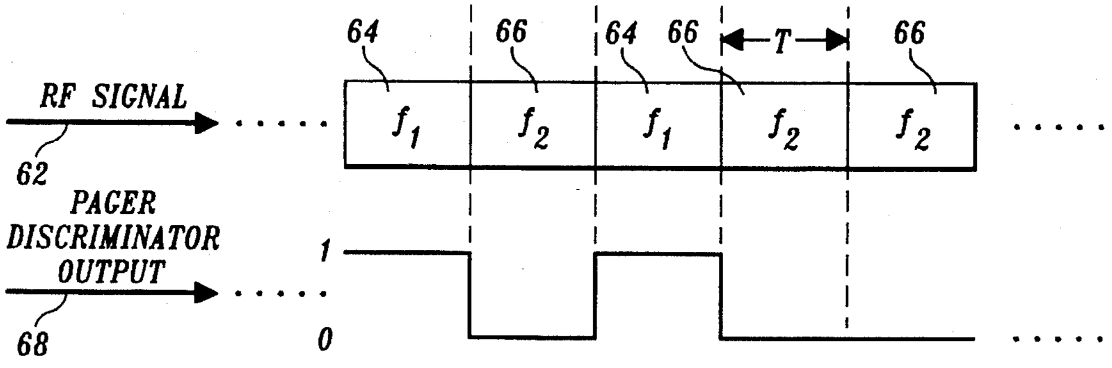
FIG. 3 is a graph showing the relationship between the frequency shift keying (FSK) signal received from a single transmitter by a receiving device and a resulting non-return-to-zero (NRZ) output signal, to illustrate an ideal case.

FIG. 3 illustrates a two-level FSK RF signal 62 and a pager discriminator output 68 that might be produced by prior art receiving device 40 in the ideal case wherein the receiver is not subjected to multipath interference and is receiving a signal from only one transmitter. As shown in FIG. 3, a first frequency 64 and a second frequency 66 are demodulated to form an NRZ signal that defines binary 1s and 0s. Each bit represented in the NRZ signal occurs during a time interval T.

Figure 4:
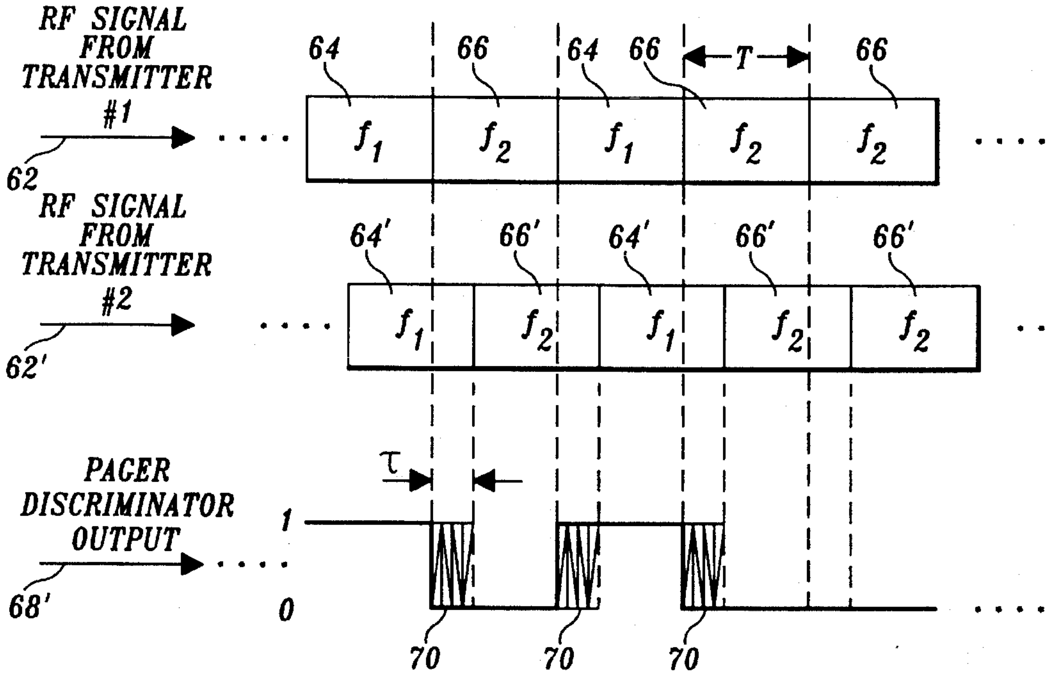
FIG. 4 is a graph intended for comparison to the graph of FIG. 3 showing the affect on the NRZ output signal of differences in the propagation time for otherwise identical signals received by the receiving device.

However, the ideal situation presented in FIG. 3 often does not exist in a simulcast communication system. Instead, as shown in FIG. 4, an RF signal 62' from a second transmitter may reach prior art receiving device 40 at a later time, $\tau$, than the RF signal 62 from a first transmitter. Accordingly, the sum of the signals received by the receiving device is impacted by an overlap of first frequency 64' and second frequency 66 when the frequency transmitted by both transmitters changes, producing a distortion uncertainty interval 70 in the pager discriminator output 68'. This overlap can cause a significant degradation in the discriminator output that may prevent recovery of the data transmitted. The same problem can occur even when receiving a signal from a single transmitter, if that signal is subject to multipath distortion caused by reflection of the transmitted signal from buildings and other objects so that the reflected signals are delayed relative to the direct signal.

Simulcast communication system 26 must deal with the same type of problem illustrated in FIG. 4. Receiver 36 is disposed within an overlap zone 34 where it receives the signals transmitted by both transmitter 32*a* and transmitter 32*b*, and the signal that it receives typically comprises the sum of the signals transmitted from these two transmitters, multipath reflections from objects between the transmitters and the receiver, and noise. These and the other sources of signal degradation in the received signal noted above would tend to limit the effective data rate in a typical prior art simulcast communication system to about 3000 baud. However, unlike prior art receiving device 40, receiver 36 employs adaptive compensation to compensate for such degradation in a dynamically changing channel through which the transmitted signals propagate.

By using adaptive compensation in connection with higher efficiency linear modulation schemes (instead of the more conventional constant envelope FSK modulation normally used in simulcast communication systems), the present invention is expected to increase the effective data rate on a 25 KHz channel to more than 16,000 baud for a linear modulation system using quadrature amplitude modulation (16 QAM) at 4 bits/baud (more than 2.56 bits/sec./Hz), or to about 20,000 baud for a system using quadrature phase shift keying (QPSK) modulation at 2 bits/baud (more than 1.6 bits/sec./Hz). The present invention achieves these higher data rates in simulcast communication system 26 in part by its ability to compensate for: (a) multipath fading; (b) differences in propagation times for the transmitted signals from transmitters 32 to reach receiver 36; (c) any motion of receiver 36; (d) differences in the frequency of transmitters 32; and, (e)lack of synchronization between the plurality of transmitters.

Figure 1B:
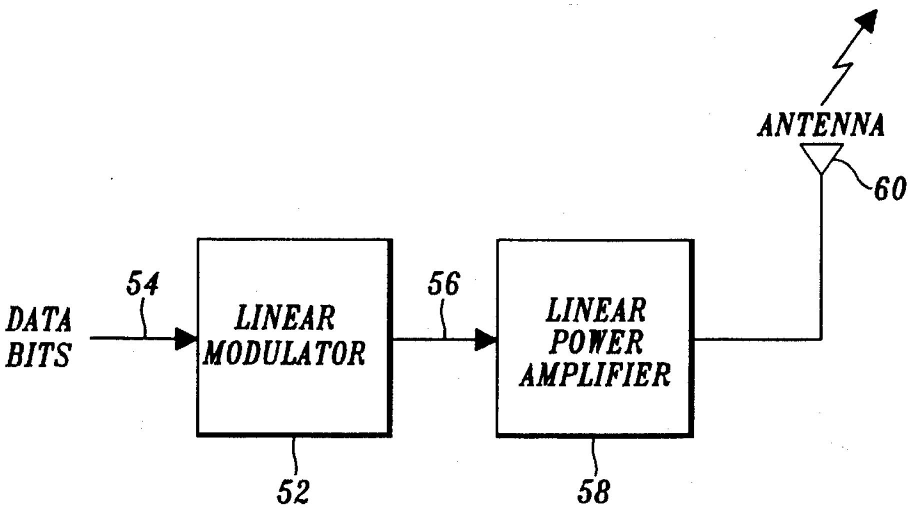
FIG. 1B is a block diagram of a linear transmitter for use in a simulcast communication system.
Figure 1C:
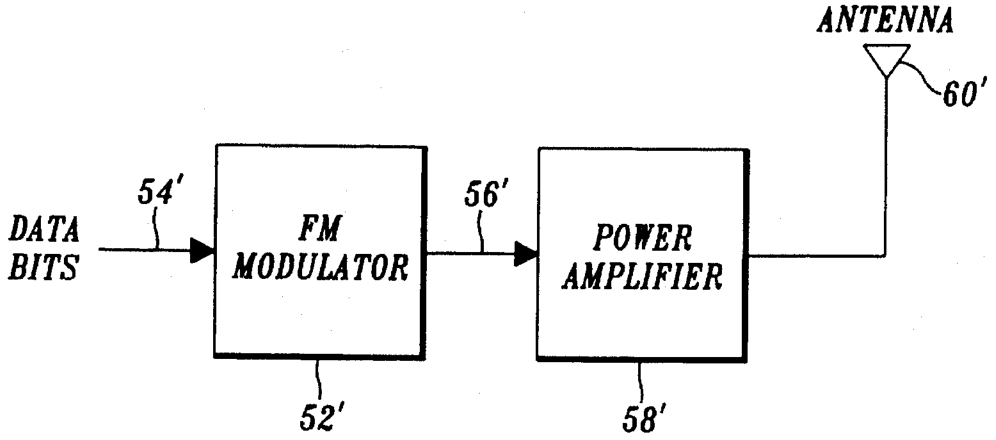
FIG. 1C is a block diagram of a constant envelope modulation transmitter for use in a simulcast communication system.

FIGS. 1B and 1C illustrate two different configurations for transmitters 32 that can be used in connection with the present invention and are particularly applicable for installation at the various base stations of a simulcast communication system. In FIG. 1B, a transmitter configuration is illustrated that includes a linear modulator 52, which provides both phase and amplitude modulation of input data supplied on a line 54. The phase and amplitude modulated signal is conveyed over lines 56 to a linear power amplifier 58 for transmission from an antenna 60. The specific type of linear modulation preferred is 16 QAM.

Alternatively, a transmitter configured as shown in FIG. 1C can be used to transmit data in the present invention. In this type of transmitter, a line 54' provides input data to a constant envelope modulator 52', which modulates the frequency of an RF signal provided over a line 56' to a power amplifier 58'. The amplified modulated signal is then transmitted from an antenna 60'. Although linear modulator 52, which was shown in FIG. 1B represents the more preferred form of modulation in simulcast communication system 26, it should be noted that constant envelope modulation systems can be used in connection with the present invention.

Figure 5A:
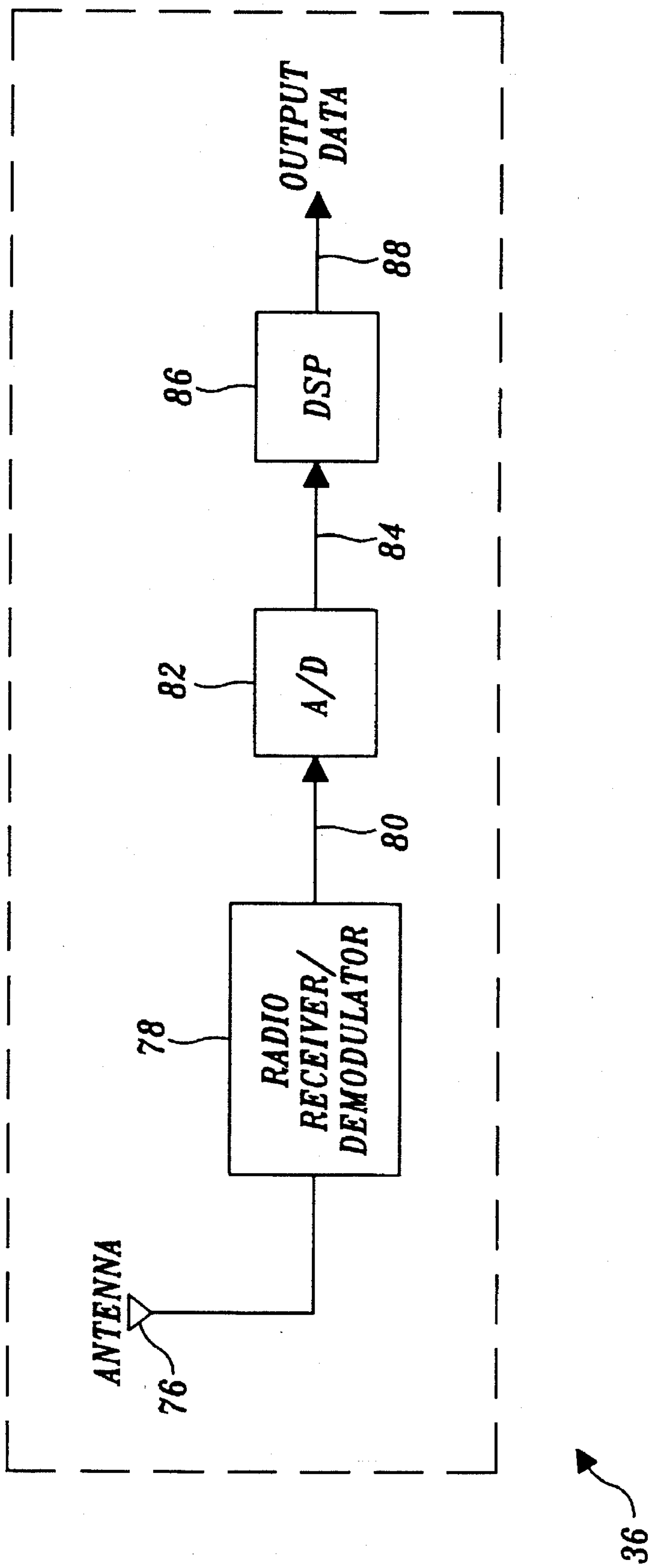
FIG. 5A is a block diagram of the hardware components of a receiving device used in a simulcast communication system in accordance with the present invention.

FIG. 5A is a block diagram showing the components of receiver 36 that implement the functions of each of the preferred embodiments disclosed below for compensating degradation in a received signal, to achieve higher speed data communication in simulcast communication system 26.

Receiver 36 includes an antenna 76 that is electrically coupled to a radio receiver/demodulator circuit 78. Radio receiver/demodulator circuit 78 is generally conventional and is designed to receive an RF signal, performing the normal operation of detecting and demodulating the signal to produce a down-converted signal that is conveyed on a line 80 to an analog-to-digital (A/D) converter 82. A/D converter 82 samples the down-converted analog signal, producing a digitized signal that is conveyed on lines 84 to a digital signal processor (DSP) 86. As those of ordinary skill in the art will appreciate, DSP 86 provides an efficient multi-capable hardware component that can be programmed to carry out a variety of different digital signal processing functions. In receiver 36, DSP 86 is programmed to process the sampled digital signal to recover the data originally transmitted in accordance with one of several different preferred embodiments of the present invention.

It is important to note that depending upon the details of radio receiver/demodulator 78, the down-converted signal on line 80 comprises either a simple intermediate frequency (IF) signal or a complex base-band signal including in-phase and quadrature components. If the down-converted signal is a complex base band signal, A/D converter 82 digitizes both the in-phase and quadrature components, providing them separately to DSP 86 for further processing to recover the transmitted data. Since the design of radio receiver/demodulator circuit 78 needed to achieve both types of down-converted signals is well known to those of ordinary skill in this art, it is not necessary to provide details of the circuit. Instead, the following description concentrates on describing the various embodiments of the means used for compensating the received signal for signal degradation implemented in DSP 86.

Figure 5B:
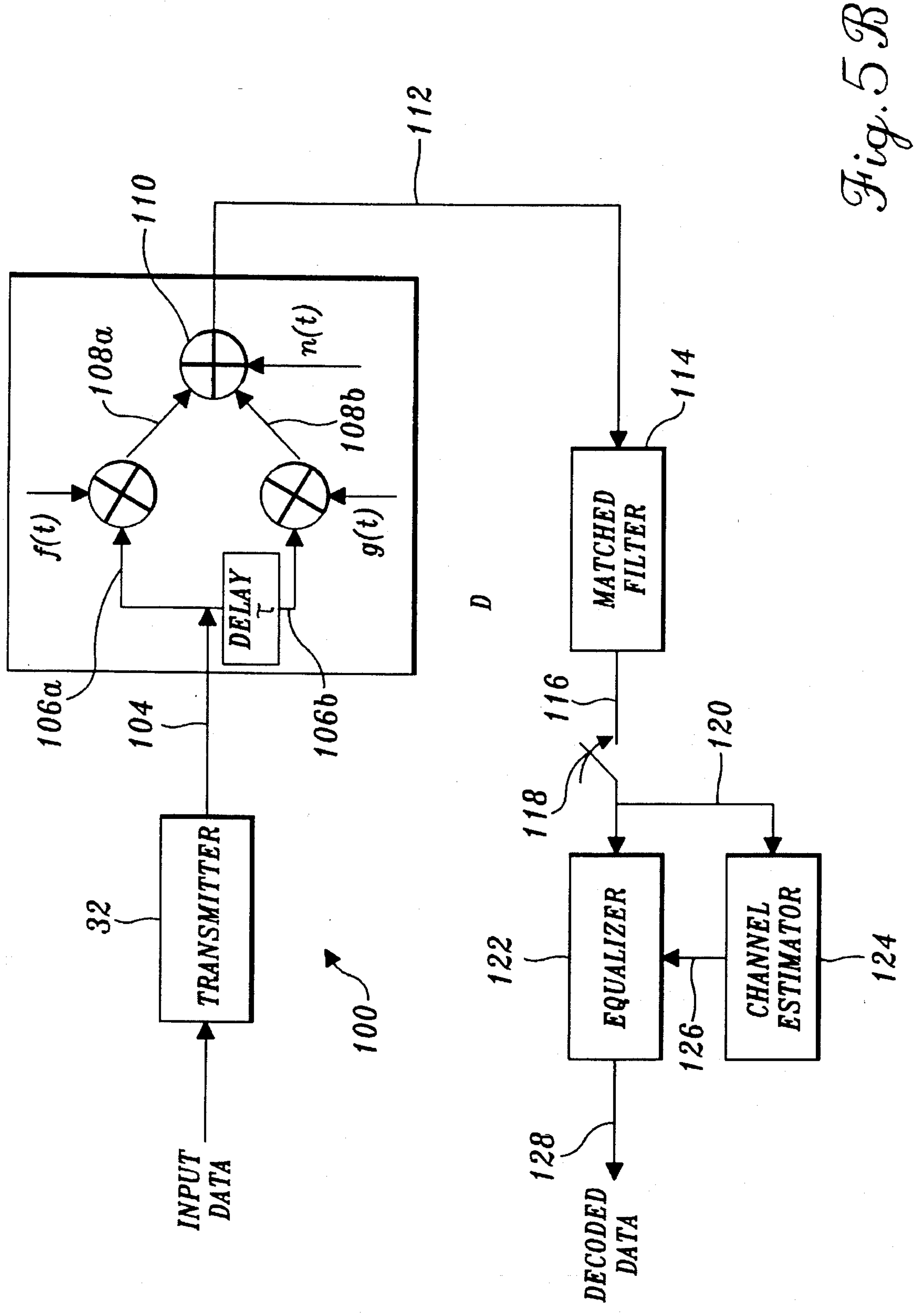
FIG. 5B is a functional block diagram of a simulcast communication system that includes a receiver that operates in accordance with the present invention.

A block diagram of simulcast communication system 26, illustrating the functional elements of the present invention is shown in FIG. 5B. A single communication channel 100 includes transmitter 32 (representative of one or more of transmitters 32*a*, 32*b*, 32*c*, . . . ), which modulates input data for transmission over a channel 104. The scheme used for modulating the data includes the step of encoding the data as data symbols, and the transmitted signal may include predefined reference or pilot symbols interspersed with the data symbols, depending upon the preferred embodiment of the present invention that is employed, as will be apparent from the following detailed description. Further, the transmitted signal is preferably linearly modulated, but can also be constant envelope modulated, as noted above.

Channel 104, through which the transmitted signal propagates, is subjected to multipath reflections and can also comprise the summation of a plurality of signals from two or more transmitters. A simple two-ray frequency selective Rayleigh fading channel 106 is illustrated to show that the transmitted signals are propagated over plural paths 106*a* and 106*b*. These paths are subjected to independent Rayleigh flat fading functions f(t) and g(t), producing independent flat fading channels 108*a* and 108*b* that are combined with an additive Gaussian noise term in n(t) as shown at a summation node 110 in FIG. 5B. The delay in path 106*b* can represent the longer propagation time caused by the signal being reflected from one or more surfaces, in the single transmitter case, or can represent the difference in the propagation time for the two paths in the case where two transmitters are transmitting the same nominal signal. The resulting received signal is conveyed on a line 112 to a matched filter 114, which filters the received signal, producing a filtered signal on a line 116. This filtered signal is periodically sampled at a node 118 (by A/D converter 82 shown in FIG. 5A), producing digitized signals that are supplied over line 120 to both an equalizer 122 and a channel estimator 124. Channel estimator 124 determines CIR estimates that are supplied to equalizer 122. In response, the inverse filter parameters of equalizer 122 are adjusted to compensate for dynamically changing channel conditions so that the equalizer produces decoded data on a line 128. Most of the different embodiments that are disclosed below relate to alternative techniques for equalizing the sampled signal and different techniques for estimating the CIR that are implemented in DSP 86.

One preferred embodiment of channel estimator 124 is the subject of a co-pending, commonly assigned U.S. patent application, Ser. No. 001,061, filed Jan. 6, 1993, entitled "COMPENSATION FOR MULTIPATH INTERFERENCE USING PILOT SYMBOLS." In this preferred embodiment, channel estimator 124 performs a CIR estimation in two stages. In the first stage, the channel estimator obtains CIR estimates at specific times from pilot symbols that are periodically embedded in the signal transmitted by transmitter 32. Channel estimator 124 then uses interpolation in a second stage to obtain the CIR estimates at other times intermediate the predefined times at which the pilot symbols occur. In this approach, the pilot symbols must be inserted at the Nyquist rate or above. Further details of this embodiment are disclosed below.

The various different embodiments of equalizer 122 are provided for channel compensating the received signals so as to compensate for the dynamically changing impulse response of a multiple-path fading channel. For example, one preferred embodiment of equalizer 122 is a hybrid approach that uses both decision feedback equalization (DFE) in a first stage of the equalizer and Viterbi equalization in a second stage.

Mathematical Model of a Multipath Channel

In the simulcast transmitter environment, each of the transmitted signals is received at receiver 36 as a sum of several replicas of the original signal transmitted, and each is multiplied by a gain, $g_n(t)$, and delayed by a delay time, $t_{dn}$. In the single transmitter case, the multiple paths are due to the reflections of the radio waves from buildings or other man-made objects, and natural physical objects. For the multiple transmitter case, the multiple paths are due to delay and synchronization differences between the multiple transmitters. The received signal, r(t) is thus defined by:

$$r(t) = \sum_{i=1}^{N} g_i(t) * s(t - t_{di}) + n_0(t) \quad (1)$$

In the case of linear modulation as provided by the transmitter configuration of FIG. 1B, the transmitted signal s(t) takes the form:

$$s(t) = \sum_{k=-\infty}^{\infty} s(k) * p(t - kT) \quad (2)$$

where s(k) is the k-th data (complex) symbol, p(t) is the transmitted pulse shape, and T is the baud duration. By comparison, for the constant envelope modulation provided by the transmitter configuration of FIG. 1C, the transmitted signal is defined by:

$$s(t) = \exp\left\{ j \sum_{k=-\infty}^{\infty} s(k)p(t - kT) \right\} \quad (3)$$

For simulcast communication system 26, the major received components are due to the direct path propagation into overlap zone 34. In other words, in the overlap zone, the dominant signals seen at receiver 36 are $s_1(t)$ and $s_2(t)$ from simulcast transmitters 32*a* and 32*b*. The typical maximum delay in such a system is as discussed above, about 74 μsec. If receiver 36 can effectively handle a delay that is slightly greater, e.g., 100 μsec, it can then compensate for the multipath distortion and other sources of degradation of the received signal.

If all gains, $g_n(t)$, and delays, $t_{dn}$ are known, the CIR is defined, allowing recovery of the transmitted signal, s(t), by filtering the received signal, r(t), with an inverse channel filter that applies the appropriate gain and delay compensation. This type of filtering is referred to as equalization and is implemented by equalizer 122, shown in FIG. 5B. In a static system where receiver 36, transmitters 32, and reflective objects that produce multipath reflections are not moving, and where transmitters 32 are perfectly synchronized, the gains and delays are constant. A static equalizer would then work perfectly well. However, in the real world, receiver 36 is likely to be mobile and the transmitters are not perfectly synchronized. Consequently, the channel is not static, and adaptive equalization techniques must be used to track the dynamically changing CIR. Accordingly, equalizer 122 preferably comprises an adaptive type equalizer and channel estimator 124 tracks the changing channel conditions to provide a corresponding changing estimate of the CIR.

If the CIR is known, then everything affecting the signal is known and all of the combinations of the possible transmitted waveforms can be constructed, filtered with the estimated CIR, and compared to the actual received waveforms. The task is then simply one of choosing the waveform that most closely matches the received waveform as representing the transmitted data symbol.

Adaptive Equalization Using Linear Modulation

Although equalization techniques are generally well known and are often used in telephone line modems, linear modulation schemes for simulcast communication systems have never before employed adaptive equalization techniques. Telephone line modems normally experience relatively static transmission channels. In such systems, predefined reference symbols are sometimes transmitted before the actual data are transmitted to initially "train" the equalizer coefficients. After this initial training period, only data are transmitted. However, this technique will not work for transmission channels such as those found in simulcast communication systems in which conditions are rapidly changing.

For one preferred embodiment of equalizer 122, blocks of predefined pilot symbols are inserted at defined intervals in the data before the signal is transmitted to serve as a basis for updating the adaptive equalizer in receiver 36. Since the predefined pilot symbols transmitted are known and can be compared to the reference symbols in the received signal, the adaptive equalizer can determine the equalizer tap coefficients required to eliminate errors in the decoded data. Details of a linear adaptive equalizer employing this technique follow.

As indicated at reference numeral 118 in FIG. 5B, the received signal r(t) is sampled periodically to generate a sequence of received samples . . . , r(−1), r(0), r(1), . . . , r(k), . . . , where the k-th sample can be written in the form:

$$r(k) = n(k) + \sum_{k=-\infty}^{\infty} s(k-n)h(k,n) \quad (4)$$

In the above equation, $$[H(k)] = (\ldots, h(k,-1), h(k,0), h(k,1), \ldots, h(k,n), \ldots) \quad (5)$$

is the equivalent discrete time CIR at a time k, and n(k) is a noise term. The different n(k)'s are independent and identically distributed, zero-mean complex Gaussian variables. The CIRs defined by this equation are also complex Gaussian variables, but are correlated in time, as well as among the different taps.

Figure 7:
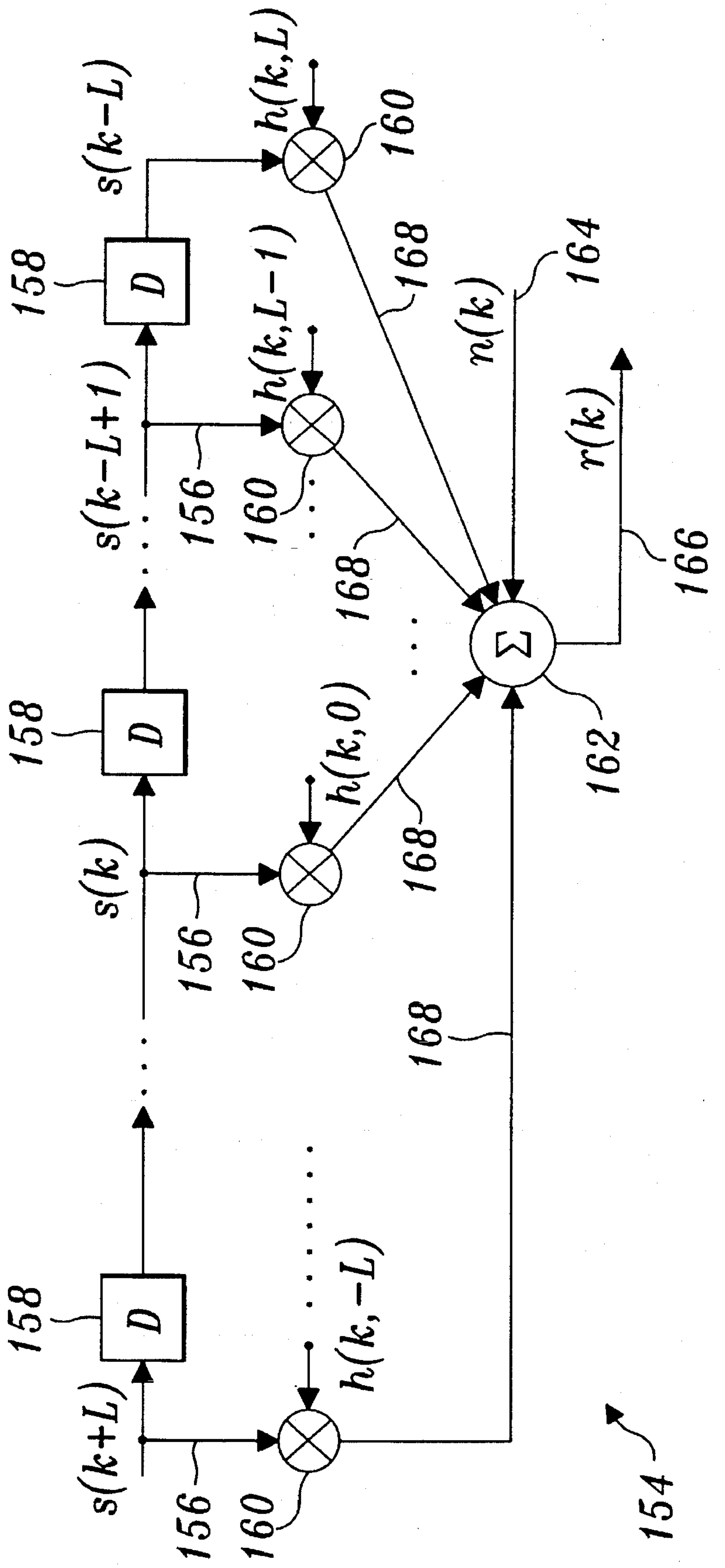
FIG. 7 is a mathematical model of a multipath channel in a simulcast communication system, illustrating the affect of channel impulse parameters on the received signal.

The structure of the discrete time channel, with an assumed memory of 2L symbols, is illustrated in FIG. 7. In this figure, a series of digital samples 156, starting at s(k–L) and running through s(k+L), are sampled at delay blocks 158. The samples are multiplied by the discrete CIRs h(k,–L) through h(k,L) at multiplier nodes 160, yielding products that are summed together with a noise term n(k), represented by a line 164, in a summation node 162. The result is the k-th sample r(k) represented by a line 166.

Overview of Linear Adaptive Equalizer

Figure 6:
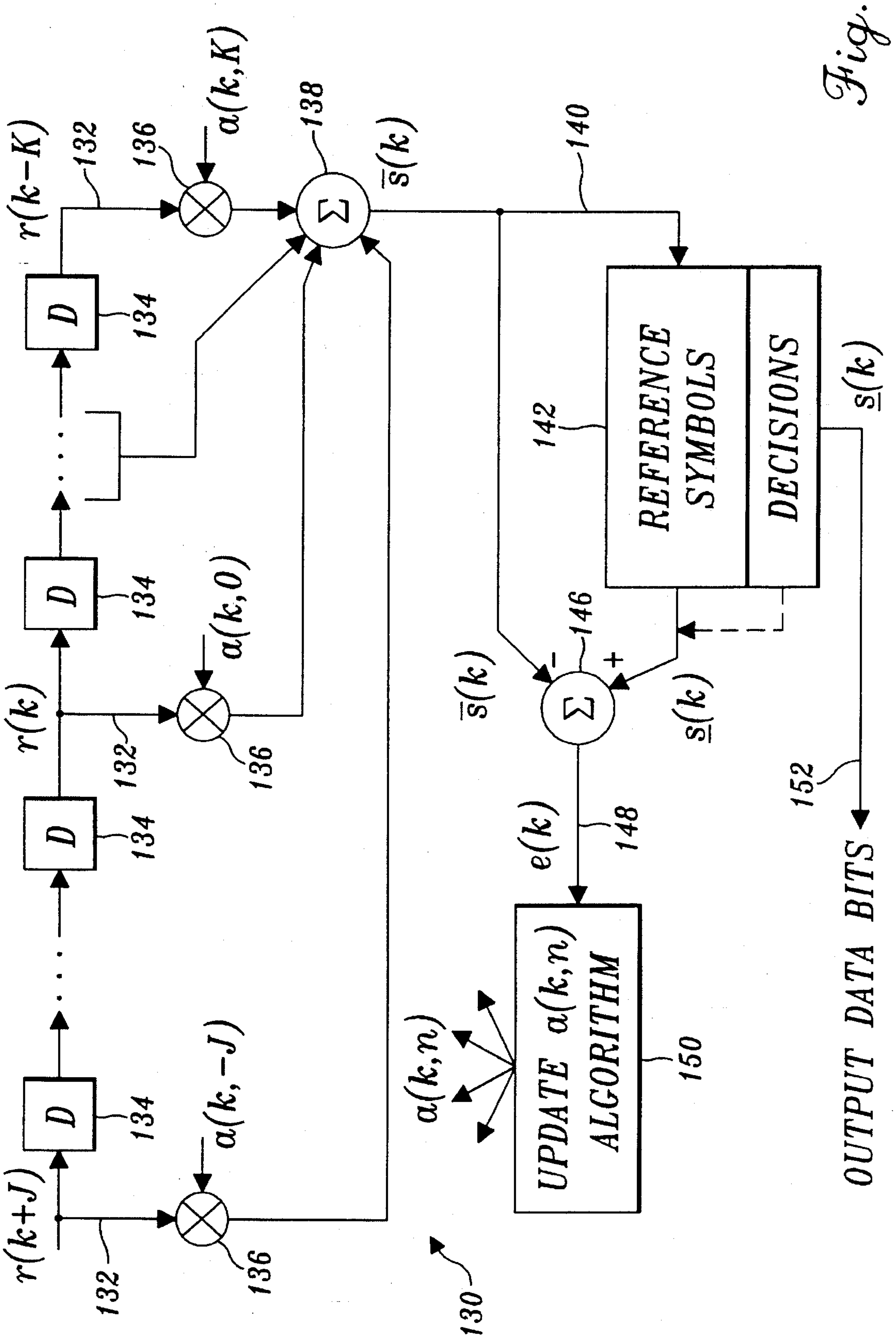
FIG. 6 is a mathematical model of a linear-adaptive equalizer as used in one preferred embodiment of the present invention.

In FIG. 6, a block diagram illustrates the functions carried out by a linear adaptive equalizer 130. At a time k, a series of digital values of the received signal, r(k–K) through r(k+J) sampled at delay blocks 134 are applied through lines 132 to a plurality of equalizer tap multiplier nodes 136, where the samples are multiplied by equalizer coefficients a(k,K) through a(k,–J). There are a total of J+K+1 equalizer taps. The resulting products are added together in a summation node 138, producing an output signal $\bar{s}(k)$ defined by:

$$\bar{s}(k)=\Sigma a(k,n)r(k-n) \tag{6}$$

where n=–J to K.

The signal $\bar{s}(k)$represents an estimate of the data symbols s(k) that were transmitted and is fed into a decoder block 144 along a line 140. The signal is also applied to a decision or reference symbols block 142 and to a differential node 146. The decisions or reference symbols block 142 determines what the received symbol should be, i.e., a corresponding $\underline{s}(k)$ value. By comparing the estimated signal $\bar{s}(k)$ with the signal that indicates what the symbol should be, $\underline{s}(k)$, an error signal, e(k), is developed that is applied on a line 148 to an update algorithm block 150. Update algorithm block 150 responds to the error, if any, to define new equalizer tap coefficients a(k,n) that are selected to reduce the error signal. The update algorithm employed to determine the new equalizer tap coefficients is preferably a least-mean-square determination; however, other well known techniques can be employed, such as recursive-least-squares. By minimizing the error through fine-tuning the equalizer tap coefficient values, linear adaptive equalizer 130 adapts to changes in channel CIR parameters, enabling decoder block 144 to produce output data on a line 152 that correspond to the data originally transmitted to the receiver.

Decisions or reference symbols block 142 uses the predefined reference symbols that are periodically transmitted and interspersed with data symbols to determine the signal $\underline{s}(k)$. This equalizer combines aspects of a linear adaptive equalizer with decision feedback. Alternatively, a pure decision feedback equalization technique can be employed, wherein a continuous stream of data symbols (without reference or pilot symbols) are transmitted to the receiving device and decisions or reference symbols block 142 determines what the signal $\underline{s}(k)$ is to calculate the error signal, e(k). Since the symbols transmitted can have only certain values, the most likely of the possible symbols are selected to comprise the $\underline{s}(k)$ signal. The advantage of using a continuous data stream in a decision feedback equalizer is that there is no loss of bandwidth like that occurring when predefined pilot symbols are periodically transmitted, interspersed with data symbols. However, the disadvantage of the decision feedback equalization technique is that excessive decision errors might be made that can cause the decision feedback equalizer to incorrectly track the channel. If sufficient decision errors occur, the receiver can lose synchronization, yielding poor performance.

A third alternative embodiment of equalizer 130 uses both pilot symbols and decision feedback to update the equalizer taps of the equalizer in order to dynamically track a channel. This technique is a compromise between the method that uses only pilot symbols as a reference and the technique that uses only decision feedback based on continuous data symbols. One of the advantages of combining decision feedback with reference pilot symbols is that less bandwidth is required than is used for the technique involving only pilot symbols. However, since pilot symbols are present in the transmitted data stream, receiver 36 properly tracks during more adverse conditions than would be possible if using simply pure decision feedback. Further, since decision feedback allows tracking of the channel to occur during the data symbol period, the equalizer combining pilot symbol and decision feedback may track better than the equalizer that uses only pilot symbol blocks. The only significant disadvantage is the slight loss in bandwidth that still occurs due to pilot symbol overhead.

It is also possible to employ only decision feedback equalization when the channels for transmitting data are subject to minimal degradation, but then switch to a combination of pilot symbol and decision feedback equalization for a channel in which moderate degradation exists, and to use only pilot symbols to decode data in a relatively poor channel subject to significant degradation. Thus, as shown in FIG. 6, decoder block 144 is linked with a dash line to decision or reference symbols block 142 enabling the decoder to provide a signal that controls the particular type of equalization employed by decisions or reference symbols block 142 to determine what the transmitted symbol signal $\underline{s}(k)$ is. Decoder block 144 can thus determine whether the channel over which the signal received is being transmitted is subject to minimal, moderate, or significant degradation, and based upon that determination, can control the type of equalization employed by decisions or reference symbols block 142.

Detailed Description of Pilot Symbol Equalization

Figure 8:
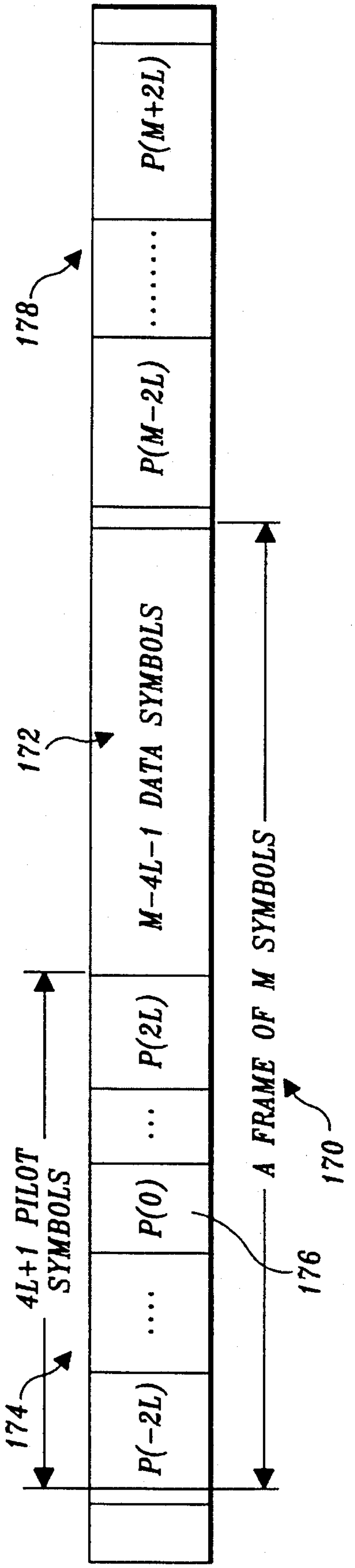
FIG. 8 is a graphical representation of a transmitted signal showing blocks of reference pilot symbols interspersed with data symbols.

FIG. 8 illustrates an exemplary frame 170 of M (total) symbols, including (4L+1) pilot symbols 174, ranging from P(–2L) through P(2L), and (M–4L–1) data symbols 172. Each successive frame 178 (only a portion of the next successive frame is shown in FIG. 8) similarly includes a block of (4L+1) pilot symbols 174 and a plurality of (M–4L–1) data symbols 172.

The overall baud rate at which a successive frame 178 of M symbols is transmitted is substantially constant. The modulated frames comprising pilot symbols and data symbols are radiated from the transmitter traveling along different Rayleigh fading channels between the transmitter and the receiving device, due to reflections from natural and man-made objects. The transmitted signal can also be subject to different Rayleigh fading channels because of transmission from multiple transmitters.

The received signal is demodulated by the receiving device. Interference between Rayleigh fading channels can cause substantial fading, making difficult the recovery of the data symbols transmitted in a conventional receiver. However, receiver 36 includes equalizer 122 (FIG. 5A) that makes use of the pilot symbols that are transmitted and interspersed with the data symbols, to recover the data symbols affected by fading and interference, thereby substantially compensating for such undesired effects.

Receive antenna 76 is coupled to radio receiver/demodulator circuit 78, which demodulates the signal r(t), producing a demodulated signal $r_K$. The demodulated signal $r_K$ is input to A/D converter 82 over a line 80. After the demodulated signal is digitized, by the A/D converter, the digitized signal is supplied to a digital signal processor (DSP) 86 over a line 84, for equalization to recover the output data, which are conveyed on a line 88. In this embodiment, DSP 86 separates the pilot symbols from the data symbols and determines an estimated CIR at defined intervals. Preferably, interpolation of the estimated CIR that is applied to successive data symbols in each frame compensates for fast fading (fast fading being defined as fading that occurs at a rate in excess of 0.5% of the baud rate) and provides more than 80 μsec of equalization for simulcast signals, as will be apparent from the following discussion.

Data symbols in successive frames are delayed during processing of the digital modulated signal by DSP 86, so that a channel estimator in the DSP can derive a CIR estimate for the current 2L+1 pilot symbols that will be used with the CIR estimate for corresponding 2L+1 pilot symbols in both successive and previous frames. The CIR estimates for the current frame are temporarily stored. Interpolated CIR estimates are determined using K CIR estimates, including K/2 CIR estimates from the previous frames, and K/2 CIR estimates from the current and successive frames. The delayed data symbols are then processed with the interpolated CIR estimates to recover the data symbols subject to fading.

A relatively straightforward interpolation operation is used to more accurately recover the data symbols. Under optimum conditions, a received signal might be subject to relatively slow fading. Slow fading conditions mean that a CIR estimate applied to each of the data symbols in a frame would be substantially constant over the duration of the frame. However, fading rates up to and exceeding 100 Hz are quite common, causing a substantially different CIR estimate to apply to the data symbols early in a frame, as compared to that which should be applied to the data symbols later in the frame. To accommodate the rapidly changing channel estimate and minimize the BER of the data recovered from the received signal during fast fading, it is important that an interpolation of the CIR estimate be applied to the data symbols over the duration of each frame. In the simplest case, a CIR estimate for the pilot symbols in the frames immediately before and after the data symbols being processed could be applied to interpolate a CIR estimate for each of the data symbols in the frame. However, a substantially lower BER can be obtained by using the CIR estimates from two or three frames before and after the frame of data symbols being processed.

Predefined channel characteristics can be used to develop an appropriate interpolated CIR estimate to apply to each of the data symbols in a frame being processed. These predefined channel characteristics include the Doppler fading frequency for the channel, the relative signal strengths of interfering signals at receiver 36, propagation delay differences between received signals that might interfere with each other, frequency offsets between the interfering signals (which is more likely to occur in simulcast paging systems, since the frequency of each simulcast transmitter may be slightly offset from the frequency of other simulcast transmitters in the system), and the signal-to-noise ratio (SNR) of the received signals. Ideally, it would be desirable to determine or measure each of these channel characteristics on a real time basis so that a current value for the specific characteristic in question is used for the interpolation. With current technology, such real time determination of the channel characteristics is not economically feasible. However, if cost is of no concern, the channel characteristics can be estimated in real time using a faster, more expensive DSP than is contemplated in the present preferred embodiment. Accordingly, the current preferred embodiment instead uses predefined worst case values for each of these channel characteristics that are applied, to determine the interpolated CIR estimates used with each data symbol in a frame being processed. Further details of the interpolation process are disclosed below.

The fading process is very much a function of the channel characteristics. The present invention therefore takes the channel characteristics into consideration when determining interpolated CIR estimates to apply to the data symbols, as explained above. The following text explains how these channel characteristics enter into this process. The auto-correlation function of two fading processes f(t) and g(t) is represented by the following two equations:

$$R\_ff\_(t')=P\_ff\ J(2\pi F_d t')\exp(j2\pi F1t') \quad (7)$$

$$R\_gg\_(t')=P\_gg J(2\pi F_d t')\exp(j2\pi F2t') \quad (8)$$

where P__ff and P__gg are variances (corresponding to the power) of two random fading processes, $F_d$ is the maximum or worst case Doppler frequency, $J(2\pi F_d t')$ is the zero-order Bessel function, t' is the variable in the auto-correlation functions, and F1 and F2 are frequency offsets of the two received signals (relative to the receiver).

The normalized root-mean-squared delay spread associated with the two-ray fading model is given by:

$$S=\frac{b\sqrt{a}}{1+a} \quad (9)$$

where a is the power split ratio and is defined by the following equation:

$$a=\frac{P\_ff}{P\_gg} \quad (10)$$

The value b in Equation (9) is the normalized relative propagation delay, defined by:

$$b=\frac{d}{T} \quad (11)$$

where T is the symbol interval (i.e., 1 divided by the baud rate).

According to the TIA Specification For A Digital Cellular System, a modulation scheme should be capable of handling a root-mean-squared delay spread of at least 20 microseconds. Assuming that a baud rate for such a system is approximately 25 kilobaud, the spread factor S defined by Equation (9) should equal 0.5. If there is an equal power split between fading channels (worst case condition), then the modulation scheme should be capable of handling a propagation delay difference of up to two symbol intervals, 2T (corresponding to the requirement that arises in simulcast communication systems, wherein a delay of 100 μsec is possible).

In this preferred embodiment, the received signal r(t) is sampled by receiver 36 at the same baud rate that the signal was transmitted. However, it should be noted that other sampling rates (e.g., integer multiples of the transmit baud rate) could alternatively be used. Since frequency selective fading occurs in each channel, the received samples r(k) can be written in the form:

$$r(k)=[S(k)][H(k)]+n(k) \quad (12)$$

where:

$$[S(k)]=[s(k+L),s(k+L-1), \ldots ,s(k-L)] \quad (13)$$

is the $k_{th}$ data and vector, s(k) is the $k_{th}$ data symbol, $$[H(k)]=[h(k,-L),h(k,1-L), \ldots ,h(k,L)] \qquad (14)$$

is the $k_{th}$ channel state vector, n(k) is the $k_{th}$ filtered noise term, and L is the memory of the channel.

In Equation (14), the [h(k,.)]' values are a set of correlated, zero mean, complex Gaussian variables, whose correlation function is determined by three parameters, including the auto-correlation functions of the channel fading processes as set forth in Equations (7) and (8), the pulse shape transmitted by transmitter 32, and the sampling instances.

FIG. 7 depicts the fading model mathematically defined by Equation (12). In FIG. 7, a discrete time model 154 of the modulation system and fading process for a series of data symbols s(k+L) through s(k–L) are sampled at spaced-apart sample times D as indicated by delay blocks 158. Each of the data symbols is multiplied by corresponding channel state vector elements h(k,–L) through h(k,L), at multipliers 160, yielding values 168 that are summed together in a summation node 162, with a noise term represented by a line 164, yielding the received signal r(k) that is conveyed on a line 166.

The purpose for transmitting a predefined set of pilot symbols is to enable a channel state or impulse response estimate to be made for each block of pilot symbols. Since the transmitter transmits a predefined set or block of pilot symbols in each frame, the effect of fading is clearly indicated by the nature of the received pilot symbols, relative to the expected (predefined) pilot symbols.

If it is assumed channel fading is sufficiently slow that the channel state vector [H(k)] is substantially constant over successive time intervals (–LT, LT), and if the noise term n(k) is ignored, it should be apparent that an estimate of the channel state vector can be obtained by multiplying a matrix of the received samples over the same time interval by the inverse of the corresponding data vector [S(k)]. However, since the data samples received, which determine the vector [S(k)], are not known for this interval, it is necessary to rely upon the predefined pilot symbols that are known. In this preferred embodiment, a total of 4L+1 pilot symbols are transmitted for each frame of M total symbols. For channels with relatively slow fading, the value M can be relatively large. As a crude guideline, M should be less than $1/(2F_dT)$. It has been empirically determined that a reasonable choice for M is about 35 for a value ($F_dT$) equal to 0.01. However, at this fade rate, the channel response changes significantly during the time interval of a frame, i.e., we are no longer dealing with slow fading. As a result, the data symbols at the beginning of a frame can be subject to a substantially different CIR than those at the end of the frame. Therefore, it is imperative that interpolation of the CIR estimates obtained from K surrounding pilot symbol blocks be used to obtain accurate interpolated CIR estimates to be applied to successive data symbols at different times within each frame, as will be explained below.

While recognizing that the slow fading case does not represent typical real world fading conditions, it is still helpful to initially consider the problem in the slow fading context. For slow fading, it is apparent that the pilot symbol matrix [P] is defined as follows:

$$[P]=\begin{vmatrix} P(O) & P(-1) & \ldots & P(-2L) \\ P(1) & P(0) & \ldots & P(-2L-1) \\ \ldots & \ldots & \ldots & \ldots \\ P(2L) & P(2L-1) & \ldots & P(0) \end{vmatrix} \qquad (15)$$

over the memory of the channel, 2L. The inverse of [P] is denoted by:

$$[Q]=[P]^{-1} \qquad (16)$$

and thus, the CIR estimate over time intervals (–L, L) for slow fading is defined by:

$$[V]=[Q][r] \qquad (17)$$

where [r]=[r(–L), r(1–L), . . . , r(L)]', where r(k) is the $k_{th}$ received sample.

Intuitively, the predefined pilot symbol sequence transmitted during each frame should be chosen in such a way as to minimize CIR estimation errors. In TABLE 1,the pilot symbol sequences for two types of linear modulation are shown, for channel memory of length 2L equal to 2, 4, and 6. The two types of linear modulation for which exemplary pilot symbol sequences are shown in the following table include: $\pi/4$ quadrature phase shift keying (QPSK) and 16 QAM.

TABLE 1

| Memory of Channel 2L | QPSK | 16QAM |
|---|---|---|
| 2 | (–1, –1, –1, 1, –1) | (–3,–3,–3,3,–3) |
| 4 | (–1, –1, –1, –1, –1, –1, –1, –1, –1) | (–3, –3, –3, –3, 3, –3, –3, –3, –3) |
| 6 | (1, –1, –1, –1, –1, 1, –1, 1, 1, –1, –1, –1, –1) | (3, –3, –3, –3, –3, 3, –3, 3, 3, –3, –3, –3 –3 |

In TABLE 1 above, the best pilot symbol sequences are listed based upon the assumption that all pilot symbols within the same block have the same phase angle. To avoid spectral spikes, the phase angles of the pilot symbol should be varied in a pseudo-random fashion from frame to frame.

In determining the sequence of pilot symbols shown in TABLE 1, channel memories longer than six were not considered, because of the limitations on throughput in receiver 36. In the case where the Doppler frequency is 0.5 percent of the signaling rate, the largest frame size is approximately 100 symbols (M). When 2L equals 6, the number of pilot symbols required in each frame is equal to 13, resulting in a maximum throughput of about 87% of capacity. Although ideally the memory 2L of the channel should be at least as large as the duration of the truncated Nyquist pulse used in the radio system, this number is too large to use without creating gross inefficiencies. Accordingly, 2L should realistically be restricted to six or less symbols in applying the present pilot symbol technique. Since the optimum number of pilot symbols is not used, a slight degradation in compensating for fading using this technique results, proportionally reducing the SNR of the radio system.

Since most radio systems, particularly simulcast systems, are subject to rapid fade rates approaching and even exceeding 100 Hz, the present technique uses interpolation to determine the interpolated CIR estimate applied to each data symbol in a frame. More importantly, as noted above, the interpolator takes into consideration predefined worst case channel characteristics in carrying out the interpolation, thereby yielding substantially improved interpolated CIR estimates that are applied to each data symbol in the frame being processed, compared to the prior art. These worst case channel characteristics are determined by modeling the channel.

Assuming a discrete multipath propagation model, the covariance matrix of [H(k)] is defined as:

$$R_{HH}(k,k)=\tfrac{1}{2}\overline{[H(k)][H(k)]'} \qquad (18)$$

wherein the bar in Equation (18) denotes a statistical average and $[H(k)]'$ is the conjugate transpose of $[H(k)]$. The covariance matrix $R_{HH}(k,k)$ is a function of four channel parameters including the maximum Doppler frequency (also referred to as the fade rate), the received signal strength for the different propagation paths (multipath propagation), the propagation delay differences for the various paths, and in the case of simulcast signals, the frequency offsets between the signals transmitted from different transmitters 32. In addition, the function defined by Equation (18) also depends on the pulse shape used in the radio system. The channel state vectors at different time instances are correlated; for example, the correlation between $[H(k)]$ and $[H(m)]$ is obtained by substituting the conjugate transpose of $[H(m)]$ for that of $[H(k)]$ in Equation (18).

From each frame of received pilot signals, an estimate of the channel state vector affecting the block of pilot symbols in that frame is derived. The channel state vector at any given data symbol in a frame is obtained by interpolating the K (or 2N) CIR estimates, which are derived from the received pilot symbol blocks from frames surrounding the frame being processed. For a given set of channel parameters and at a given data symbol position within a frame, there exists an optimal interpolated CIR estimate, which is determined as described below. Given the conditions stated above, wherein there are M symbols per frame of which 4L+1 are pilot symbols, and assuming that the first pilot symbol for the $k_{th}$ block starts at a time kM−2L, a CIR estimate $[V(kM)]$ derived from the $k_{th}$ pilot symbol block is defined by the following equation:

$$[V(kM)] = [E(kM)] + \sum_{i=0}^{2L} [M(i)][H(kM-L+i)] \tag{19}$$

where the matrix $[M(i)]$, i=0, 1, . . . 2L, is the product of [Q] in Equation (16) and a matrix obtained by replacing every row of [P], except the $i_{th}$ row, by zeroes. Further, the matrix $[E(k)]$ is a noise component of the estimate. The correlation between two CIR estimates $[V(k)]$ and $[V(m)]$ is defined by:

$$R_{vv}((k-m)M) = [R(ee)]\delta(k-m) + \sum_{i=0}^{2L}\sum_{j=0}^{2L} [M(i)]\, R_{HH}(i-j+(k-m)M)[M(j)]' \tag{20}$$

where $\delta(k-m)$ is unity when k=m, $[R(ee)]$ is the covariance matrix for the noise vector [E], and $R_{HH}$ is the correlation between two channel state vectors. It is assumed that $R_{HH}$ is only a function of the time difference between k and m, rather than a function of k and m.

If [U] is defined as equal to $[H(n)]$, where $[H(n)]$ is the channel state vector at time n, the correlation between [U] and $[V(k)]$ is defined by:

$$R_{vu}(kM,n) = 1/2\overline{[V(kM)][H(n)]'} = \sum_{i=0}^{2L} [M(i)]R_{HH}(kM-n+i-L) \tag{21}$$

and the correlation between [U] and the channel state vector $$[V] = \begin{bmatrix} V((k-N)M) \\ \cdots \\ V((k+N)M) \end{bmatrix}$$

is given by:

$$[R(vu)] = 1/2\overline{[V][U]'} = \begin{vmatrix} R_{vu}((k-N)M-n) \\ R_{vu}((k-N+1)M-n) \\ \cdots \\ R_{vu}((k+N)M-n) \end{vmatrix} \tag{22}$$

A covariance matrix for [V] is defined by:

$$[R(vv)] = ½\overline{[V][U]'} = \begin{vmatrix} R_{vv}(0) & R_{vv}(M) & \cdots & R_{vv}((K-1)M) \\ R_{vv}(M) & R_{vv}(0) & \cdots & R_{vv}((K-2)M) \\ \cdots & \cdots & \cdots & \cdots \\ R_{vv}((K-1)M) & R_{vv}((K-2)M) & \cdots & R_{vv}(0) \end{vmatrix} \tag{23}$$

The correlation matrix $[R(vu)]$ and the covariance matrix $[R(vv)]$ uniquely determine an optimal interpolator $[F(opt)]$ that defines the interpolated CIR estimates, as indicated by the following equation:

$$[F(opt)]=[R(uv)][R(vv)]^{-1} \tag{24}$$

In Equation (24), $[R(uv)]$ is the conjugate transpose of $[R(vu)]$, and $[R(vv)]^{-1}$ is the inverse of $[R(vv)]$. The size of this optimal interpolator is L+1 rows and K(L+1) columns. In addition, each row of the optimal interpolator matrix is an interpolated value for a respective component in the channel state vector. Furthermore, the optimal interpolator depends specifically on the data symbol position n, since $[R(uv)]$ is a function of n.

CIRs for the data portion of a frame are obtained from matrix multiplication of the form:

$$[W]=[F(opt)][V] \tag{25}$$

where $[F(opt)]$ is the optimal interpolator from Equation (24) and [V] is the channel state vector. There is one such operation for each data symbol, and if:

1. $[W(i)]$ is the channel estimate for the i-th data symbol;
2. r(i) is the received signal for the i-the data symbol, and
3. $[S(i)]=[s(i+L), \ldots s(i-L)]$ is the data vector defined by Equation (8), then, the optimal decoder will select the data vector $[S]=[s(2L+1), \ldots s(M-2L-1)]$ that minimizes the expression:

$$D([S]) = \sum_{i=1}^{M-L-1} |r(i) - [S(i)][W(i)]|^2 \tag{26}$$

where r(i) is the $i_{th}$ received data symbol, $[W(i)]$ is the interpolated CIR for the $i_{th}$ received data symbol, M is a total number of data symbols and pilot symbols in each frame, and 2L+1 is a duration for the CIR of the received signals. The optimal decoder that carries out this function is preferably a Viterbi decoder, but a reduced complexity sequence estimator, such as one that implements the M-algorithm (as discussed below), is used in this preferred embodiment to reduce processing overhead.

Based upon the above theoretical development, it should be apparent that the correlation $R_{HH}(k,m)$ between the channel state vectors at two different times depends upon the Doppler frequency or fade rate, the power (or SNR) of each of the two fading processes, the normalized propagation delay difference between signals received, and any frequency offsets between two propagation paths (in a simulcast communication application). Since the optimal interpolator $[F(opt)]$ in Equation (24) depends on the correlation $R_{HH}(k,m)$, it should be evident that the optimal interpolator used in this embodiment of the present invention also depends upon these predefined channel parameters.

In summary, the optimal interpolator used in the present application for interpolating the CIR to apply to data symbols in a frame being processed, is determined by taking into consideration the channel characteristics, and its determination involves six steps: (1) the memory of the discrete time channel 2L is determined (a value of 1 through 6), based upon the transmit/receive pulse shapes and the expected maximum delay difference in a multipath channel (limited to considerations of processing efficiency and time); (2) based upon the selected value for L, an optimal pilot symbol sequence is determined, for example using one of the sequences shown in Table 1; (3) using the selected pilot symbol sequence, matrices [P], [Q], [R(ee)], and [M(i)] are determined as explained above; (4) based upon the value of L, the pulse shape used in the transmissions, expected (or worst case) number of paths for a signal propagating in the radio channel, and the expected (or worst case) propagation delay difference, explicit expressions for each component of the channel state vector are determined; (5) based on the expected (or worst case) Doppler frequency, the expected (or worst case) signal strength distribution among the different rays arriving at the receiver, and the results obtained from the preceding step, the correlation between any two channel state vectors is determined as indicated above in Equation (18); and, (6) the optimal interpolator for a given data symbol is determined using the correlation matrices computed in the preceding step and the matrices computed in the third step.

To define the channel characteristics used in the preceding process of determining the optimal interpolator, the channel can be modeled for predefined conditions, or worst case conditions can be determined from the model based upon known signal propagation factors. Once the constraints or predefined channel parameters used to determine the optimal interpolator are defined, these constraints are stored in memory available to DSP 86 for interpolation to determine the appropriate interpolated CIR estimate to apply to each successive data symbol, as a function of those CIR estimates and as a function of the preceding and succeeding blocks of pilot symbols.

Besides the optimal interpolator defined in Equation (20), polynomial interpolators can also be used for channel estimation. The order of these polynomial interpolators is simply the number of pilot symbol blocks K used in the initial channel estimation process. Since K depends on the model for the fading spectrum and on the maximum Doppler frequency, $f_d$, the polynomial interpolators are also functions of the channel characteristics. When these polynomial interpolators are used, the different components of the CIR are interpolated independently.

Decoder block 144 (in FIG. 6) selects a data vector for each data symbol from a set of possible values of data vectors, [S], by determining a minimum value for the expression, D([S]), which is defined above in Equation (21). To find the minimum of the expression for D([S]), the conventional Viterbi decoder algorithm would normally be used. The complexity of the Viterbi decoder can be very high. For example, in the above expression, if S(i) is 4-ary (i.e., for QPSK modulation) and if the channel memory is 6 symbols (L=6), the number of states in the Viterbi decoder is 4,096 ($4^6$) and 16,384 ($4*4^6$) squared distance calculations per data symbol are required for the Viterbi decoder. At a data rate of 20,000 baud, 327 million squared distance calculations per second are required. Clearly, calculating that many parameters in real time is not feasible. However, several algorithms have been developed to reduce the complexity of the Viterbi algorithm to provide an alternative reduced complexity sequence estimator. The M-algorithm is one such reduced complexity algorithm; this algorithm only retains the M states of the set [S] for which the expression is minimized. If 128 states are retained, a maximum of 512 (4*128) squared distance calculations per data symbol are required for QPSK. A 20,000 baud data rate requires a maximum of 10.24 million squared distance calculations per second—a more realistically obtainable processing load for currently available processors. Reducing the number of states retained further reduces the number of calculations required and thus, the processing requirements of the algorithm can be tailored to the processor's capabilities.

The Viterbi algorithm is theoretically optimal in that it always chooses the set [S] with the minimum squared error. In contrast, the M-algorithm is sub-optimal in that it may not always choose the set [S] with the minimum squared error; however, the performance of the M-algorithm approaches that of the Viterbi algorithm with significantly less processing power. For these reasons, this preferred embodiment implements the decoder using the reduced complexity M-algorithm.

Figure 9:
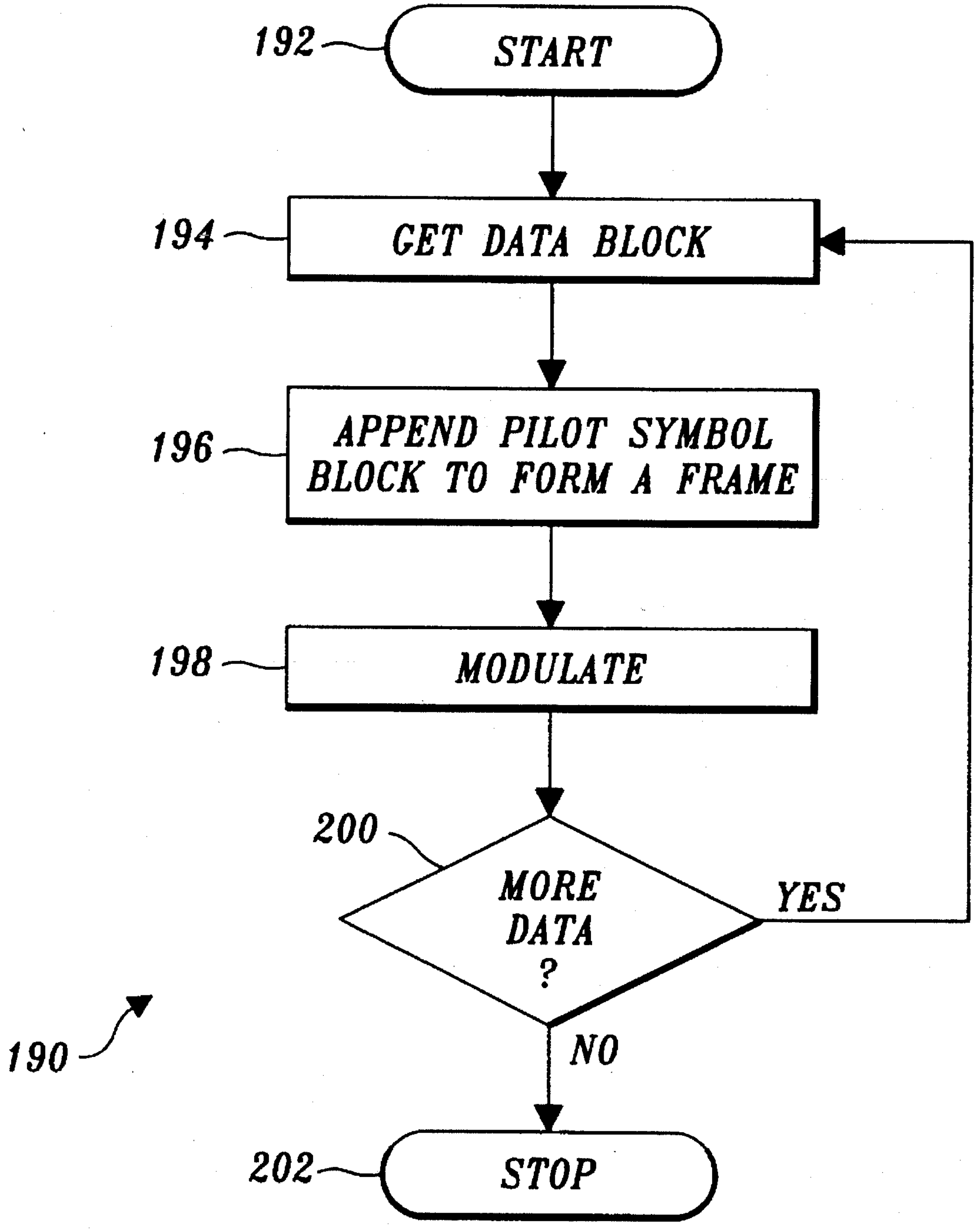
FIG. 9 is a flow chart showing the steps used by a transmitter in providing predefined pilot symbol blocks interspersed with frames of data.

Pilot Symbol Processing Logic Implemented at the Transmitter and at the Receiver The logical steps performed at each transmitter to encode the signal transmitted with a plurality of pilot symbols in successive frames are illustrated in a flow chart 190 in FIG. 9. Flow chart 190 begins at a start block 192 and proceeds to a block 194, wherein an additional block of data is obtained from the input signal. In a block 196, a set of pilot symbols are appended to the data symbols to form a frame. The frame is then modulated by transmitter 32 in a block 198. A decision block 200 determines if more data is available, i.e., if the input signal is still present for sampling and modulation, and if so, returns to block 194 for input of the additional data. If not, the logic proceeds to a stop block 202.

Figure 10:
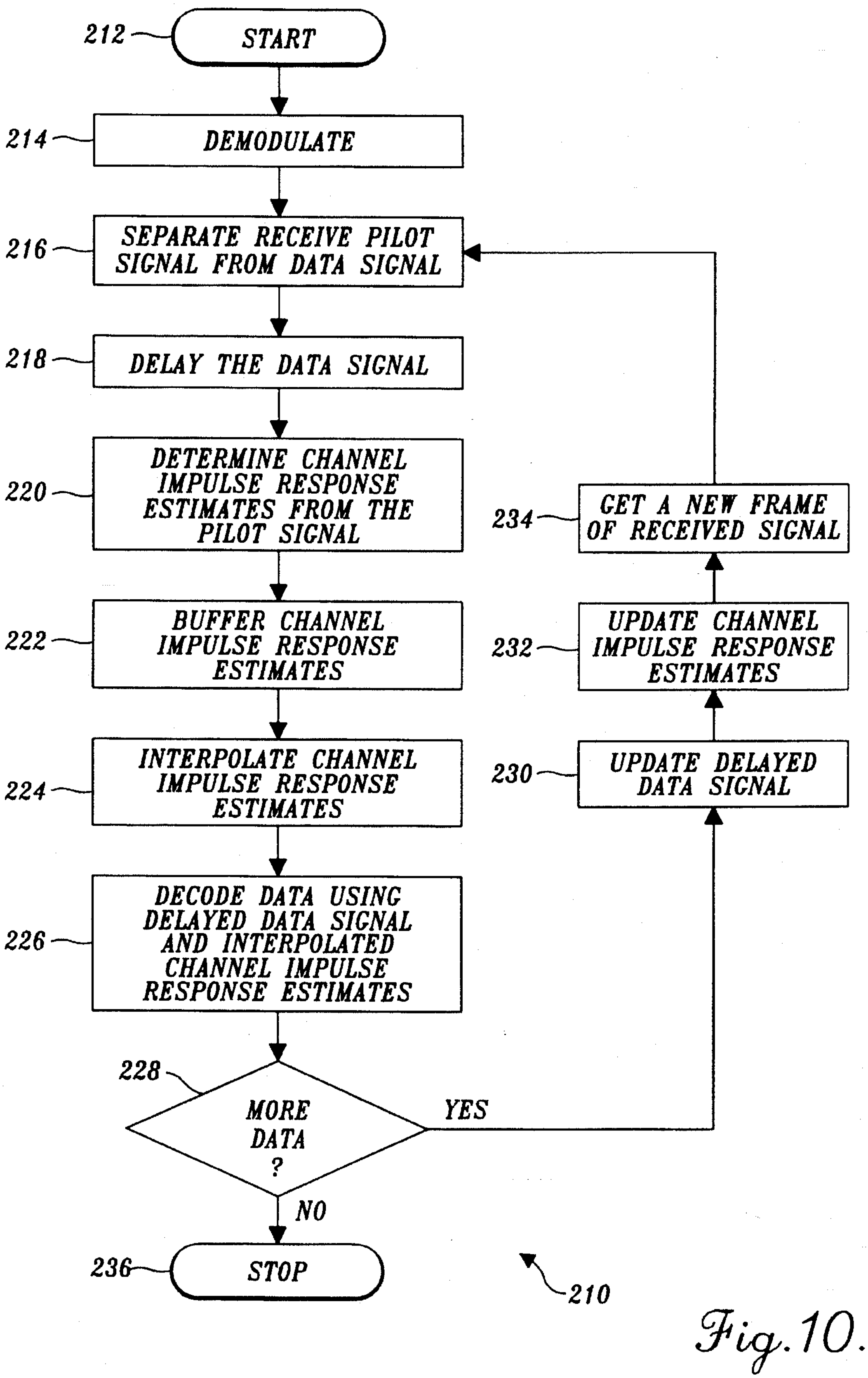
FIG. 10 is a flow chart showing the steps implemented at the receiving device to decode data, where reference pilot symbols transmitted with the data are used to determine the CIR.

In FIG. 10, a flow chart 210 illustrates the steps carried out by receiver 36 in processing the received signals, which may be affected by simple fading, and fading due to either multipath interference and/or simulcast interference. From a start block 212, the logic proceeds to a block 214 wherein the received signal is demodulated. Thereafter, a block 216 provides for separating the received pilot symbols in each frame from the data symbols, producing a corresponding pilot signal and data signal.

In a block 218, the data signal is delayed for K/2 frames. The pilot signal is then processed in a block 220 to determine CIR estimates. A block 222 buffers the CIR estimates, providing temporary storage to enable interpolation of the pilot signal using pilot symbols from frames preceding and following a current frame of data symbols being processed.

A block 224 then interpolates the CIR estimates as described above, so as to determine an appropriate interpolated CIR estimate to apply to each data symbol in the frame being processed. In a block 226, the data are decoded by processing the delayed data signal using the interpolated CIR estimates that should appropriately be applied to each successive data symbol in that frame. A decision block 228 determines whether any more data are available to be processed and if not, proceeds to a block 236 wherein processing is halted. Otherwise, the logic proceeds to a block 230 that updates the delayed data signal with the next frame of data symbols. A block 232 then updates the CIR estimates for that frame, and a block 234 obtains a new frame from the received signal for processing, beginning with block 216.

Viterbi Decoder Equalization

Figure 11:
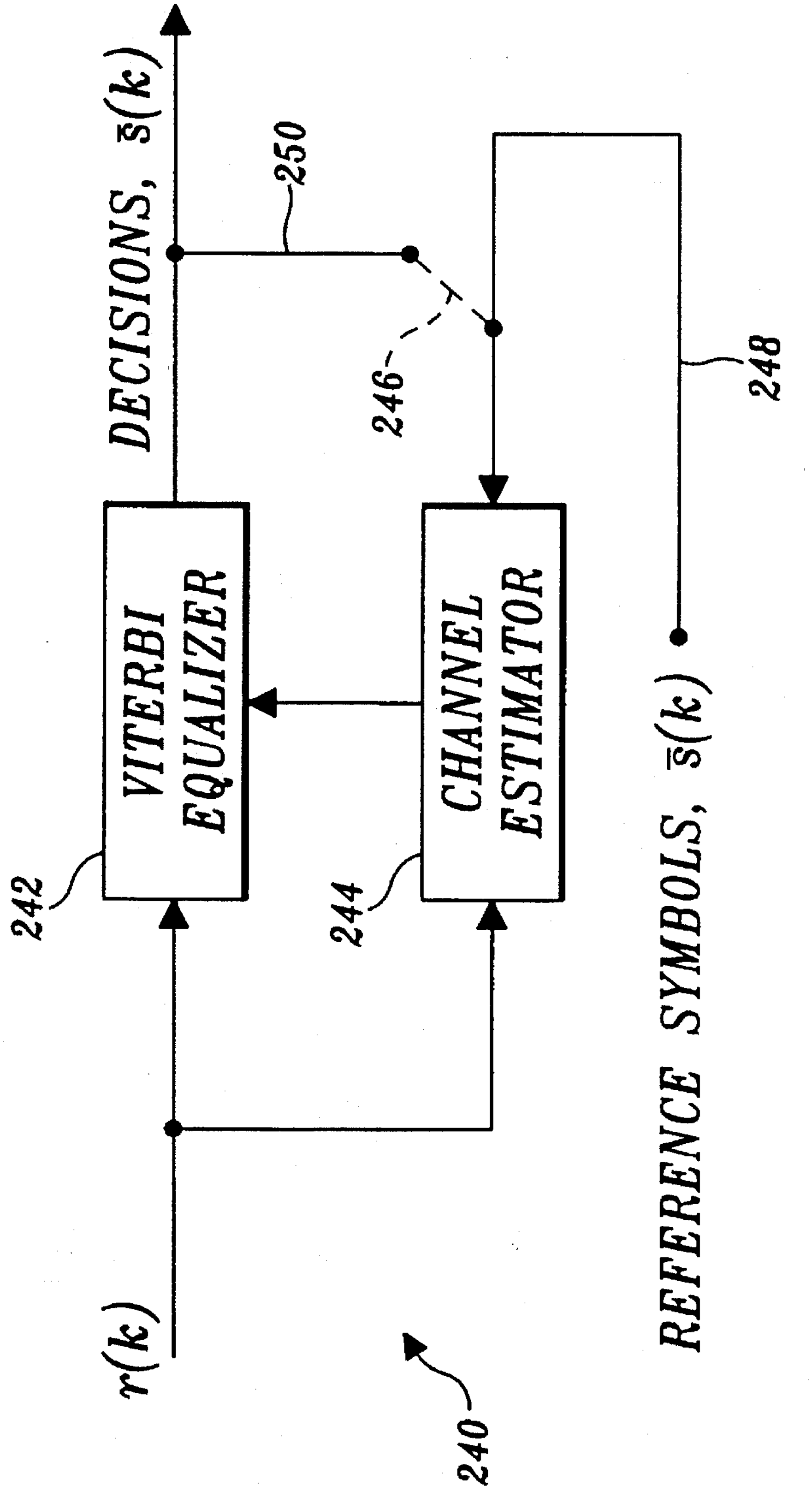
FIG. 11 is an equalizer employing a Viterbi decoder and channel estimator to determine received data symbols.

Referring to FIG. 11, an equalizer 240 is shown as another embodiment used for decoding data transmitted through a multipath channel. Equalizer 240 employs a Viterbi equalizer 242, and includes a channel estimator 244, which determines the various gain coefficients and delay coefficients of a multipath received signal r(k) that is input to Viterbi equalizer 242 and channel estimator 244. Viterbi equalizer 242 evaluates all possible combinations of input symbols for a window that encompasses a predetermined number of symbols that were last received and chooses the most likely symbol for the sequence $\bar{s}(n)$. Preferably, the channel estimator uses reference symbols supplied on a line 248 to determine and update the CIR estimate. Alternatively, as indicated by a dash line 246, channel estimator 244 uses the most likely symbol $\bar{s}(n)$ determined by the Viterbi equalizer as an input to update CIR estimates.

Ideally, a full Viterbi algorithm would be used by Viterbi equalizer 242; however, the complexity of the Viterbi algorithm becomes relatively high with dense constellation signaling schemes. For example, using a 16 QAM scheme and a channel memory of only five symbols, the number of possible combinations that must be evaluated by Viterbi equalizer 242 is over one million for each symbol. The processing overhead that would result by carrying out this complete Viterbi algorithm evaluation would tend to slow the throughput to an unacceptable level. Accordingly, a preferred embodiment of the equalizer illustrated in FIG. 11 uses only a subset of the most likely paths, thereby saving orders of magnitude of processing time. The results obtained by using this reduced complexity equalizer estimator are very close to that achievable using the full Viterbi algorithm. In the preferred embodiment, a reduced complexity M-algorithm is implemented.

Figure 12:
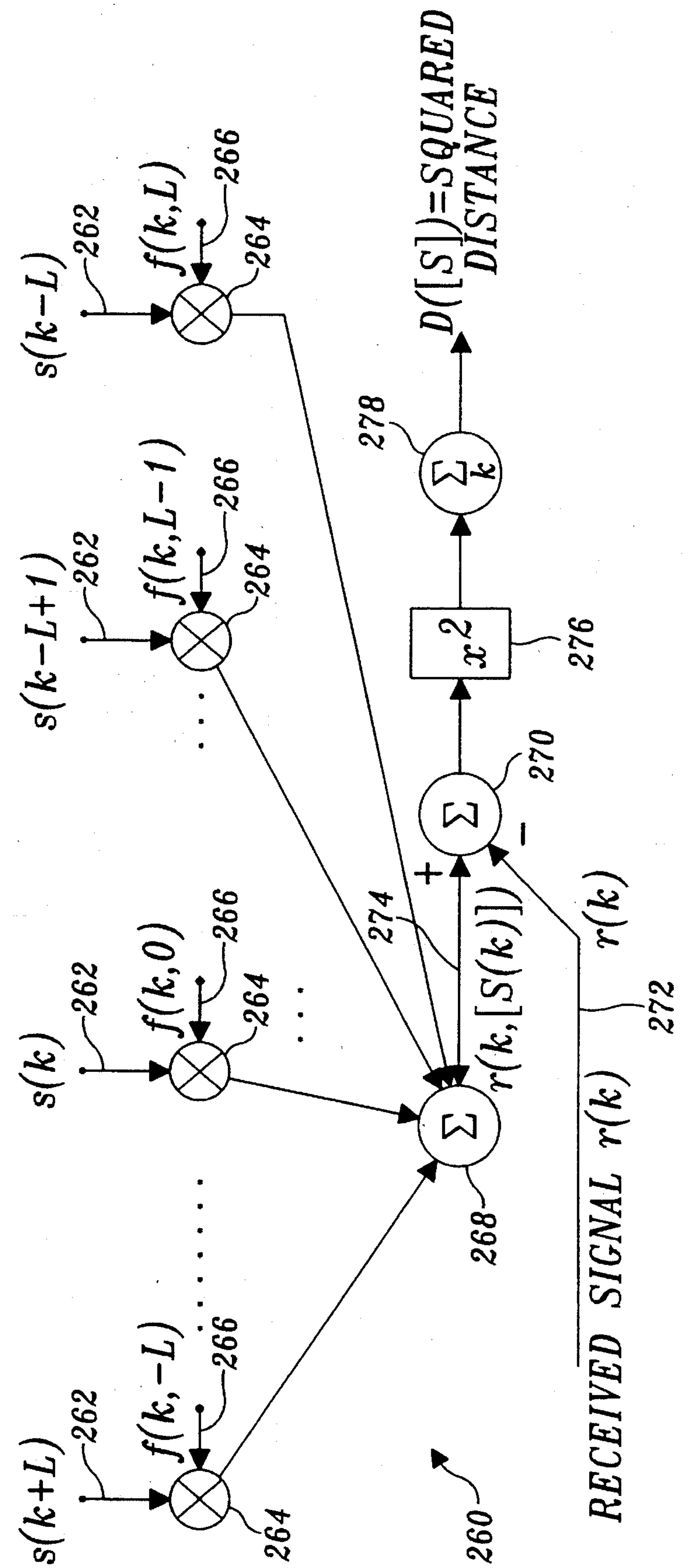
FIG. 12 is a mathematical model of a Viterbi decoder metric used in the one embodiment of the present invention.

FIG. 12 illustrates a block diagram of a Viterbi decoder metric employed to provide a reduced complexity estimate of the most probable symbol transmitted. A plurality of S(k) values 262 extending between s(k+L) and s(k–L) denote the k-th segments of a possible data sequence. Viterbi equalizer 242 (i.e., the reduced complexity sequence estimator) determines for each index k, the squared distance between the actual received signal, r(k), and the reconstructed signal, $\bar{r}$(k,[S(k)]), the sum of the squared distances for the different segments, and then present the sum as the likelihood of the sequences [S]=( . . . ,s(–1), s(0), s(1), . . . ). Multiplier nodes 264 multiply the current CIR estimates times each of the k segments, and a summation node 268 adds the resulting products to produce the reconstructed signal, represented by a line 274. A differential node 270 determines the difference between the reconstructed signal and the received signal, r(k), represented by line 272, providing an input to squared operator block 276. Finally, a summation block 278 evaluates the sum of the squares to determine the likelihood of the sequences.

Each element, s(k) of the set, [S], can take on all possible values of the modulation constellation being used, i.e., 16 values for 16 QAM. The Viterbi equalizer (or its reduced complexity counterpart) selects the set, [S], that minimizes the squared distance, since this set then represents the most likely set transmitted. The application of the Viterbi algorithm or alternatively, the reduced complexity sequence estimator, effectively mitigates the degradation of a multipath channel, so long as the channel estimate, [F], accurately reflects the actual CIR.

Bi-Directional Decision Feedback Equalizer

Figure 13:
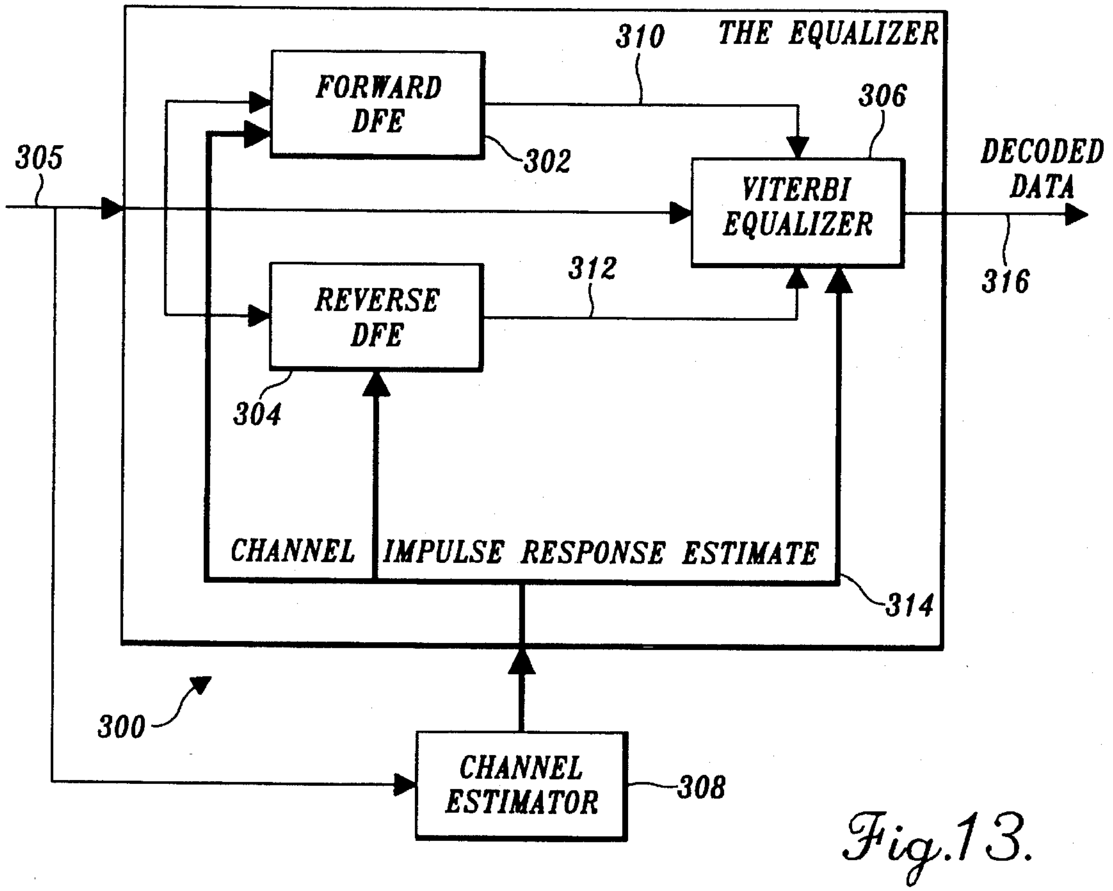
FIG. 13 is a block diagram of a bi-directional decision feedback equalizer used in one embodiment of the present invention.

Turning now to FIG. 13, a bi-directional decision feedback equalizer 300 (BDFE) is shown that employs a Viterbi equalizer 307 in a hybrid approach to decoding data. BDFE 300 includes a first stage of equalization comprising a forward DFE 302 and a reverse DFE 304, both of which are coupled to a line 306 over which received signal r(k) is applied. In addition, the received signal is input to Viterbi equalizer 307 and to a channel estimator 308. The CIR estimates produced by channel estimator 308 are coupled to both the Viterbi equalizer and to the forward and reverse DFE's in this form of the embodiment.

The BDFE improves on the error performance of the equalizers disclosed in the preceding embodiments by accommodating simulcast communication systems in which significant non-minimum phase occurs, e.g., at levels up to 50 percent of the time. By performing equalization in reverse time, as well as in the more conventional forward direction, BDFE 300 is able to convert essentially all non-minimum phase channels to minimum phase channels. The only penalty to this approach is an increase in the decoding delay, which fortunately, is not critical in many applications. Both forward DFE 302 and reverse DFE 304 produce a tentative decision concerning the sequences of data transmitted; these tentative sequence estimates are conveyed to Viterbi equalizer 307 by lines 310 and 312, respectively. Viterbi equalizer 307, which represents a second stage of equalization, selects between the two tentative sequence estimates and processes the selected estimate to produce decoded data that are output on line 316. The Viterbi algorithm implemented by Viterbi equalizer 307 is an optimal strategy for switching between the two possible sequences of tentative decisions.

Figure 15:
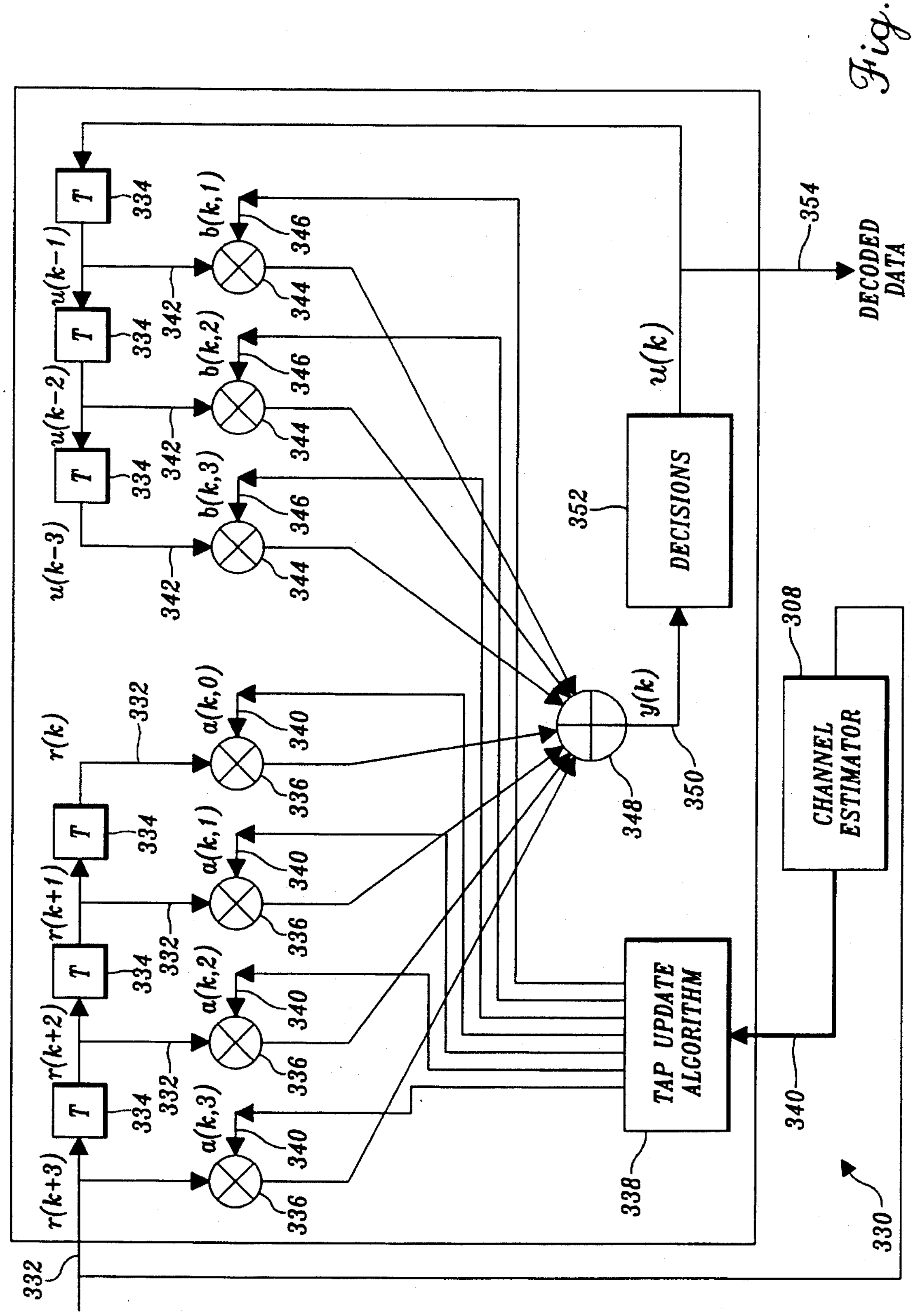
FIG. 15 illustrates a mathematical model of a channel estimator driven decision feedback equalizer used in the embodiment of FIG. 13.

A mathematical model of a channel estimator driven DFE is shown in FIG. 15, generally at reference numeral 330. In this illustration, there are four taps 332 for the feedforward filter, each of which are applied to multiplier nodes 336 for multiplication by the feedforward filter coefficients a(k,0) through a(k,3) identified by reference numerals 340. Similarly, there are three taps 342 for the feedback filter that are applied to multiplication nodes 344 for multiplication by the feedback filter coefficients b(k, 1) through b(k,3) identified by reference numerals 346. It has been found that this combination and number of taps (4,3) provides the best compromise between complexity and error performance. Accordingly, subsequent discussions are restricted to this configuration.

For the r(k)'s applied to each of the feedback taps 334 of the channel estimator driven DFE shown in FIG. 15, products are defined that are added in a summation node 348 to determine the value for y(k) as indicated by the following:

$$y(k) = \left( \sum_{n=0}^{3} a(k,n)r(k+n) \right) + \left( \sum_{m=1}^{3} b(k,m)u(k-m) \right) \tag{27}$$

where:

$$[A(k)]=(a(k,0),\ a(k,1),\ \ldots,\ a(k,3)) \tag{28}$$

are the coefficients for the feedforward filter of the DFE at time k, and $$[B(k)]=(b(k,1),\ b(k,2),\ b(k,3)) \tag{29}$$

are the feedback filter coefficients. A decision block 352 produces an output u(k) that feeds back to the feedback taps 334. When u(k)=s(k), there is no decoding error.

Based on the value y(k), the decoder in the receiving device makes a decision on s(k). The reliability of this decision is a function of the mean squared error between s(k) and its estimate y(k). To derive the optimal DFE (in the mean squared error sense), the following assumptions are used: (1) all past decisions are correct, i.e., u(k−1)=s(k−1), u(k−2)=s(k−2), and u(k−3)=s(k−3); and, (2) the channel estimate [F(k)] equals the actual channel response [H(k)]. It can be shown that:

$$\begin{bmatrix} b(k,1) \\ b(k,2) \\ b(k,3) \end{bmatrix} = \begin{bmatrix} f(k,1) & f(k+1,2) & f(k+2,3) \\ f(k,2) & f(k+1,3) & 0 \\ f(k,3) & 0 & 0 \end{bmatrix} \begin{bmatrix} a(k,0) \\ a(k,1) \\ a(k,2) \end{bmatrix} \quad (30)$$

and that $$[A(k)]=[C(k)]([G(k)][G(k)]'+[I])^{-1} \quad (31)$$

where:

$$[C(k)]=[f^*(k,0), f^*(k+1,1), f^*(k+2,2), f^*(k+3,3)] \quad (32)$$

is a row vector of size 4, [I] is a 4×4 identity matrix, and [G(k)] is defined by the following 4×7 matrix:

$$[G(k)] = \begin{bmatrix} f(k,0) & f(k,-1) & f(k,-2) & f(k,-3) & 0 & 0 & 0 \\ f(k+1,1) & f(k+1,0) & f(k+1,-1) & f(k+1,-2) & f(k+1,-3) & 0 & 0 \\ f(k+2,2) & f(k+2,1) & f(k+2,0) & f(k+2,-1) & f(k+2,-2) & f(k+2,-3) & 0 \\ f(k+3,3) & f(k+3,2) & f(k+3,1) & f(k+3,0) & f(k+3,-1) & f(k+3,-2) & f(k+3,-3) \end{bmatrix} \quad (33)$$

In comparing the preceding two equations, it is evident that vector [C(k)] is simply the Hermitian transpose of the first column of [G(k)]. In accordance with mathematical convention, the notation ( ) * is used to denote a complex conjugate of a number and [ ]' is used to denote the Hermitian transpose of a matrix. For the reverse DFE, the output of reverse DFE 304 used for decoding the symbol s(k) can be written as:

$$y(k) = \left( \sum_{n=0}^{3} a(k,n)r(k+1-n) \right) + \left( \sum_{m=1}^{3} b(k,m)u(k+m) \right) \quad (34)$$

where:

$$\begin{bmatrix} b(k,1) \\ b(k,2) \\ b(k,3) \end{bmatrix} = \begin{bmatrix} f(k+1,0) & f(k,0) & f(k-1,0) \\ f(k+1,-1) & f(k,-1) & 0 \\ f(k+1,-2) & 0 & 0 \end{bmatrix} \begin{bmatrix} a(k,0) \\ a(k,1) \\ a(k,2) \end{bmatrix} \quad (35)$$

$$[A(k)] = [a(k,0), \ldots, a(k,3)] = [C(k)] ([G(k)][G(k)]' + [I])^{-1} \quad (36)$$

$$[C(k)] = [f^*(k+1,1), f^*(k,0), f^*(k-1,-1), f^*(k-2,-2)] \quad (37)$$

$$[G(k)] = \begin{bmatrix} f(k+1,1) & f(k+1,2) & f(k+1,3) & 0 & 0 & 0 & 0 \\ f(k,0) & f(k,1) & f(k,2) & f(k,3) & 0 & 0 & 0 \\ f(k-1,-1) & f(k-1,0) & f(k-1,1) & f(k-1,2) & f(k-1,3) & 0 & 0 \\ f(k-2,-2) & f(k-2,-1) & f(k-2,0) & f(k-2,1) & f(k-2,2) & f(k-2,3) & 0 \end{bmatrix} \quad (38)$$

Figure 14:
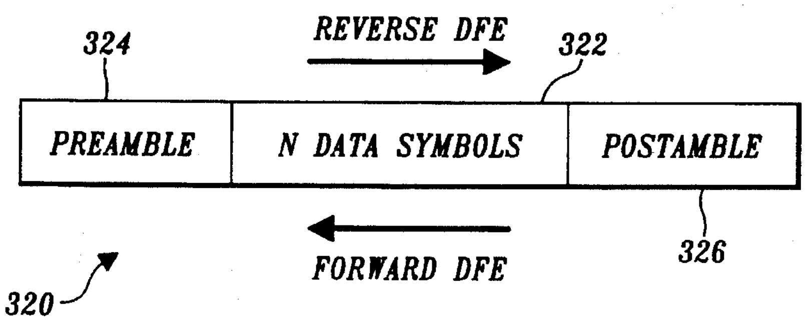
FIG. 14 is a symbolic diagram representing a frame format for data symbols processed by the equalizer of FIG. 13.

Forward DFE 302 and reverse DFE 304, respectively, produce a sequence of detected symbols denoted by:

$$[U]=(u(1), u(2), \ldots, u(N)) \quad (39)$$

$$[V]=(v(1), v(2), \ldots, v(N)) \quad (40)$$

where u(k) represents the forward DFE's estimate of the s(k), and v(k) is the reverse DFE's estimate of s(k), for N data symbols in each frame as shown in FIG. 14. The N data symbols are in a block 322 that is preceded by a preamble block 324 and followed by a postamble block 326. The sequence developed by the forward DFE proceeds from preamble block 324 to postamble block 326, whereas the reverse DFE proceeds in the opposite direction.

Based on these two sequences, the following strategy can be adopted by Viterbi equalizer 306 in making a decision as to which of the two sequences to use. First, the following metrics are determined:

$$M(U) = \sum_{k=-2}^{N+3} \left\| r(k) - \sum_{n=-3}^{3} u(k-n)f(k,n) \right\|^2 \quad (41)$$

$$M(V) = \sum_{k=-2}^{N+3} \left\| r(k) - \sum_{n=-3}^{3} v(k-n)f(k,n) \right\|^2 \quad (42)$$

Note that for any time index (k−n) less than unity, the symbol u(k−n), which is equal v(k−n), can be replaced by the corresponding symbol in the preamble block. Similarly, for any (k−n) greater than N, u(k−n) can be replaced by the appropriate symbol in postamble block 326. If M(U) is smaller than M(V), then Viterbi equalizer 307 selects the forward DFE sequence as the most likely transmitted. Alternatively, if the reverse is true, then the output sequence from reverse DFE 304 is selected instead.

Figure 16:
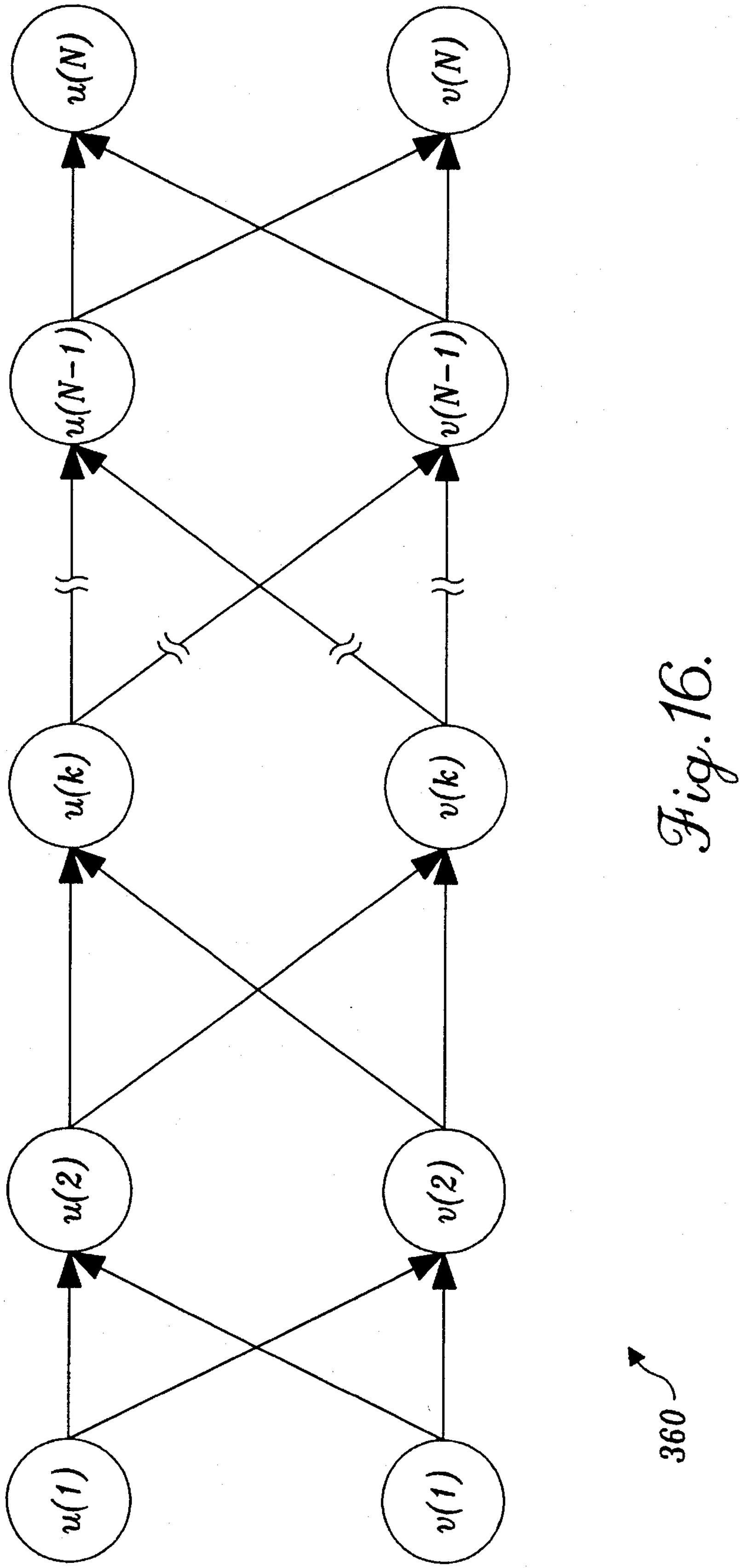
FIG. 16 is a trellis diagram for time varying binary modulation.

The preceding strategy for making the decision between the forward and reverse DFE sequences is unfortunately not optimal. At best, it can double the correct frame probability of the individual DFE's. However, since the individual correct frame probabilities are relatively small to begin with, as has been verified through actual simulations, this strategy does little to improve the actual BER of the system. Instead, the optimal strategy is as follows: (1) construct all possible N-length sequences (from [U] and [V]), of which there are $2^N$ such possibilities; (2) for each sequence [W]=[w(1), . . . ,w(N)] as obtained from the preceding step, compute the following metric:

$$M(W) = \sum_{k=-2}^{N+3} \left\| r(k) - \sum_{n=-3}^{3} w(k-n)f(k,n) \right\|^2 \quad (43)$$

and, (3) select the sequence with the smallest metric as the most likely transmitted one. Note that if the time index associated with w(i) is less than 1 or greater than N, it can simply be replaced with the appropriate preamble or postamble symbol. The suboptimal decision described above for deciding between the sequences represented by M(U) and M(V) corresponds to the case where only the top and bottom two paths in the trellis of FIG. 16 are considered.

It should be noted that the computation in the preceding equation can be carried out via a Viterbi algorithm with 64 states. The only difference between this equation and a conventional Viterbi equalization algorithm is that the equation is based on a time-varying binary signal constellation as shown by a trellis 360 in FIG. 16, whereas a conventional Viterbi equalization is based on a fixed constellation. The determination provided by the above equation can be more expeditiously developed by first locating error bursts and then performing sequence estimation only for those error bursts. In this case, an error burst is said to have occurred in the time interval [k,k+m] if, and only if, all of the following conditions are met: (1) $u(k)\neq v(k)$; (2) $u(k+m)\neq v(k+m)$; (3) $u(n)=v(n)$ for $n=k-1, \ldots k-6$ and $n=k+m+1, \ldots, k+m+6$; and (4) the pairs $[u(n), v(n)]$ are not different for more than five consecutive n's in the interval [k,k+m]. The optimal selection of the sequence in accordance with this technique provides a form of diversity effect, which tends to translate into an improvement and a reduced BER.

Referring back to FIG. 13, it should be noted that CIR estimates produced by channel estimator 308 are required only for Viterbi equalizer 307 and need not necessarily be provided to forward and reverse DFE's 302 and 304, respectively. Accordingly, the embodiment of FIG. 13 can be modified so the channel estimator 308 is not coupled to provide CIR estimates to the DFE's. Although this modification would tend to make the hi-directional equalizer less robust in dealing with dynamic changes in the channel, use of the channel estimates by Viterbi equalizer 307 can to some extent compensate. However, if CIR estimates are available, there is really no logical reason not to use them in the DFEs.

Logical Steps Used in the Bi-Directional Decision Feedback Equalizer

Figure 17:
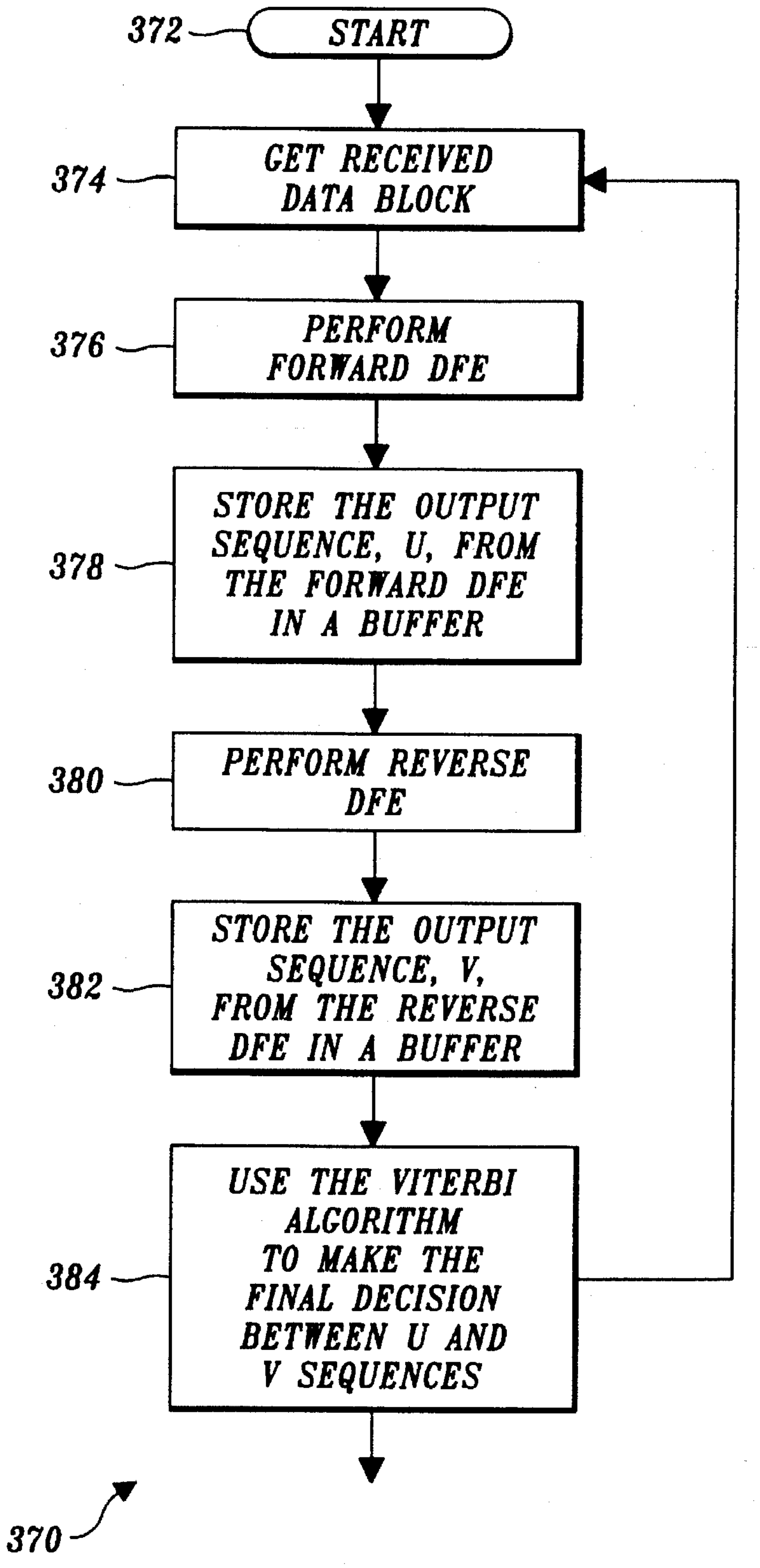
FIG. 17 is a flow chart showing the logic employed in the bi-directional decision feedback equalizer.

As shown in FIG. 17, a flow chart 370 illustrates the logical steps implemented in bi-directional decision feedback equalizer 300. Beginning at a start block 372, the logic proceeds to a block 374 that provides for obtaining a received data sample (after the received signal is demodulated and digitized). A block 376 then performs the forward decision feedback equalization to determine the tentative output sequence, U, in the forward direction. In a block 378, the tentative output sequence U, which was developed by forward DFE 302, is stored in a temporary buffer while DSP 86 (shown in FIG. 5A) performs the reverse DFE in a block 380. The tentative output sequence determined by reverse DFE 304 is also then temporarily stored in a buffer, as noted in a block 382. DSP 86 applies the Viterbi algorithm, selects the most likely combination of the decisions from the two output sequences U and V to determine $\bar{s}(k)$.

Figure 18:
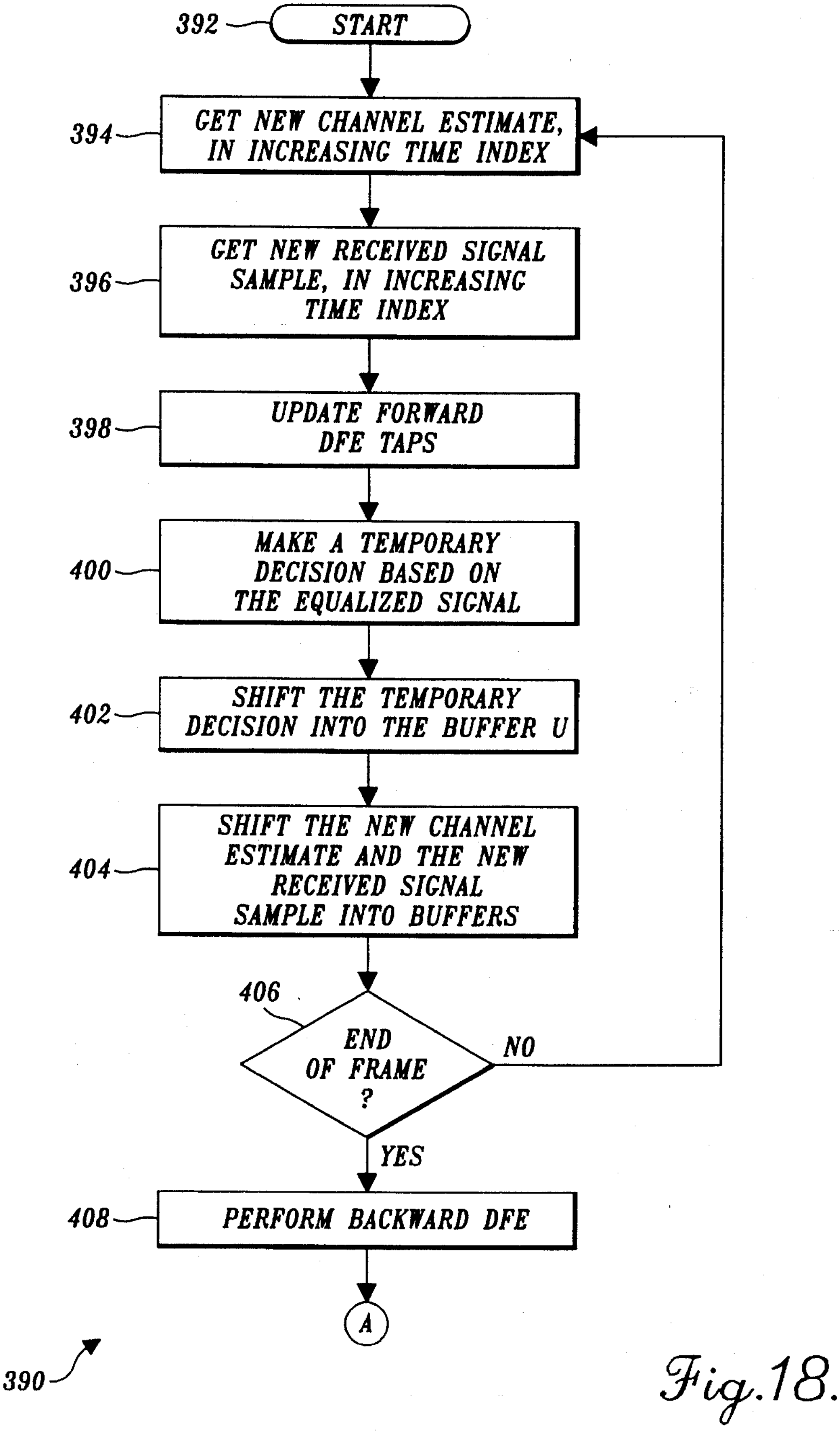
FIG. 18 is a flow chart illustrating the logical steps used to perform forward decision feedback equalization of a received signal.

Details of the processing carried out by forward DFE in block 376 are illustrated in a flow chart 390 in FIG. 18. Proceeding from a start block 392 to a block 394, DSP 86 obtains a new channel estimate having an increasing time index. Then, in a block 396, a new received signal sample is obtained with an increased time index, i.e., a sample later in time than the preceding sample. A block 398 provides for updating the forward DFE filter taps using CIR estimates determined by the channel estimator (if used; as noted above, the forward and reverse DFE's can be implemented without dynamically modifying the tap coefficients, although this technique is less preferred).

A block 400 indicates that the DSP makes a temporary decision based upon the equalized signal. The temporary decision as to the sequence of data symbols U is then shifted into the buffer in a block 402. A block 404 provides for shifting a new channel estimate and a new received signal sample into temporary buffers for storage.

In a decision block 406, a check is made to determine if the current signal sample represents an end of a data frame and, if not, the logic returns to block 394 to obtain a new channel estimate for the current frame. However, if the end of frame has been reached, the logic proceeds to a block 408 that initiates the backward decision feedback equalization at "A."

Figure 19:
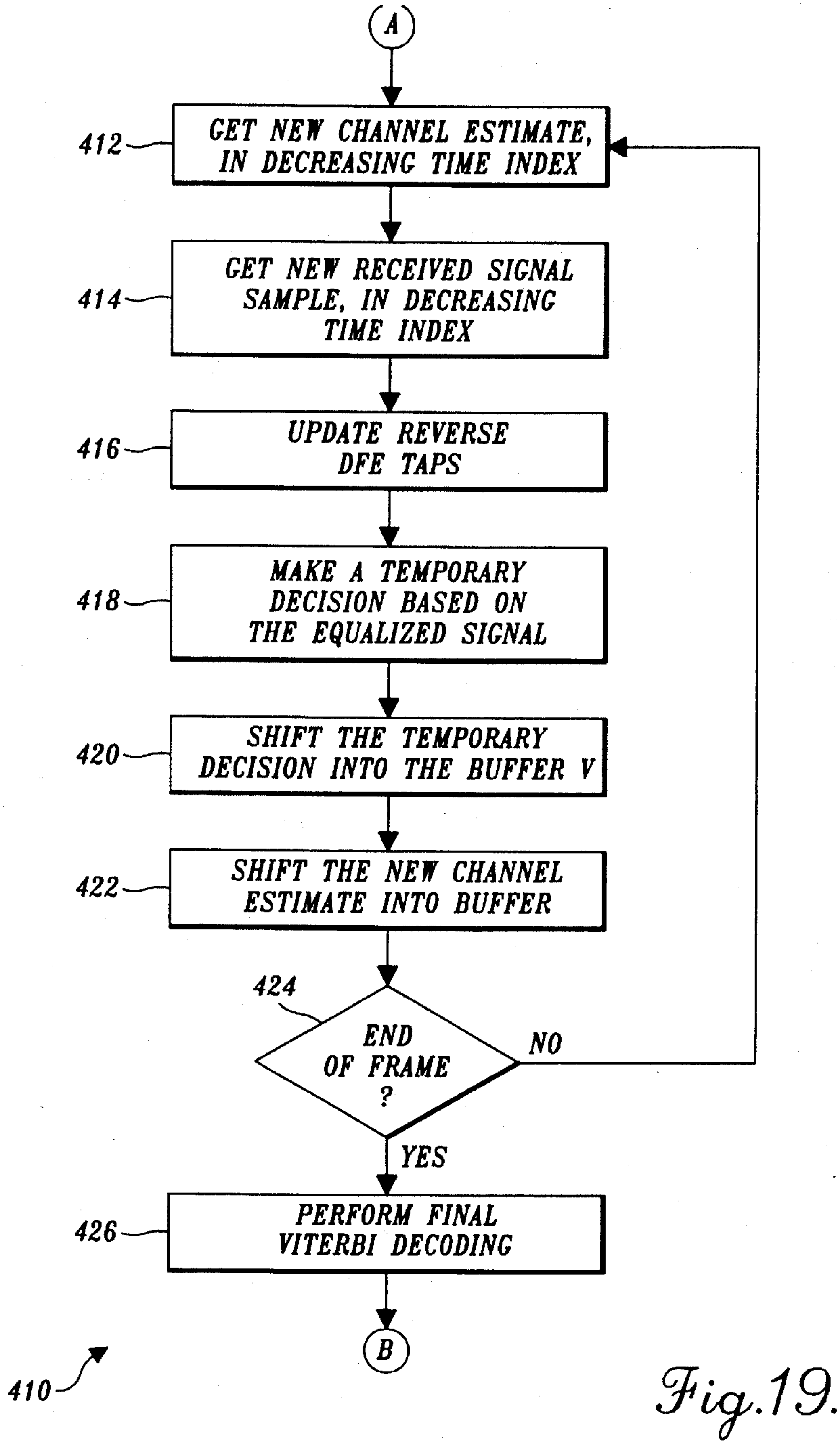
FIG. 19 is a flow chart illustrating the logical steps used to perform reverse decision feedback equalization of a received signal.

Turning to FIG. 19, the reverse DFE logic is implemented in a flow chart 410 proceeding from "A." In a block 412, a new channel estimate is obtained for a decreasing time index, i.e., for the preceding time instance. In a block 414, a new received signal sample one period back in time is obtained from the temporary buffer in which it is stored. In a block 416, the coefficients for the filter taps for the reverse DFE are updated (assuming that the channel estimator is also supplying CIR values to the reverse DFE). A block 418 provides for making a temporary decision V based upon the reverse equalized signal, which is then shifted into temporary storage in a block 420. In a block 422, a new channel estimate is shifted into temporary storage in a buffer in the DSP and a decision block 424 then evaluates the status of the processing to determine if an end of frame has been reached. If not, the logic returns to block 412, or conversely, proceeds to a block 426 to perform the final Viterbi decoding in the second stage of the equalization process, which proceeds at "B."

Figure 20:
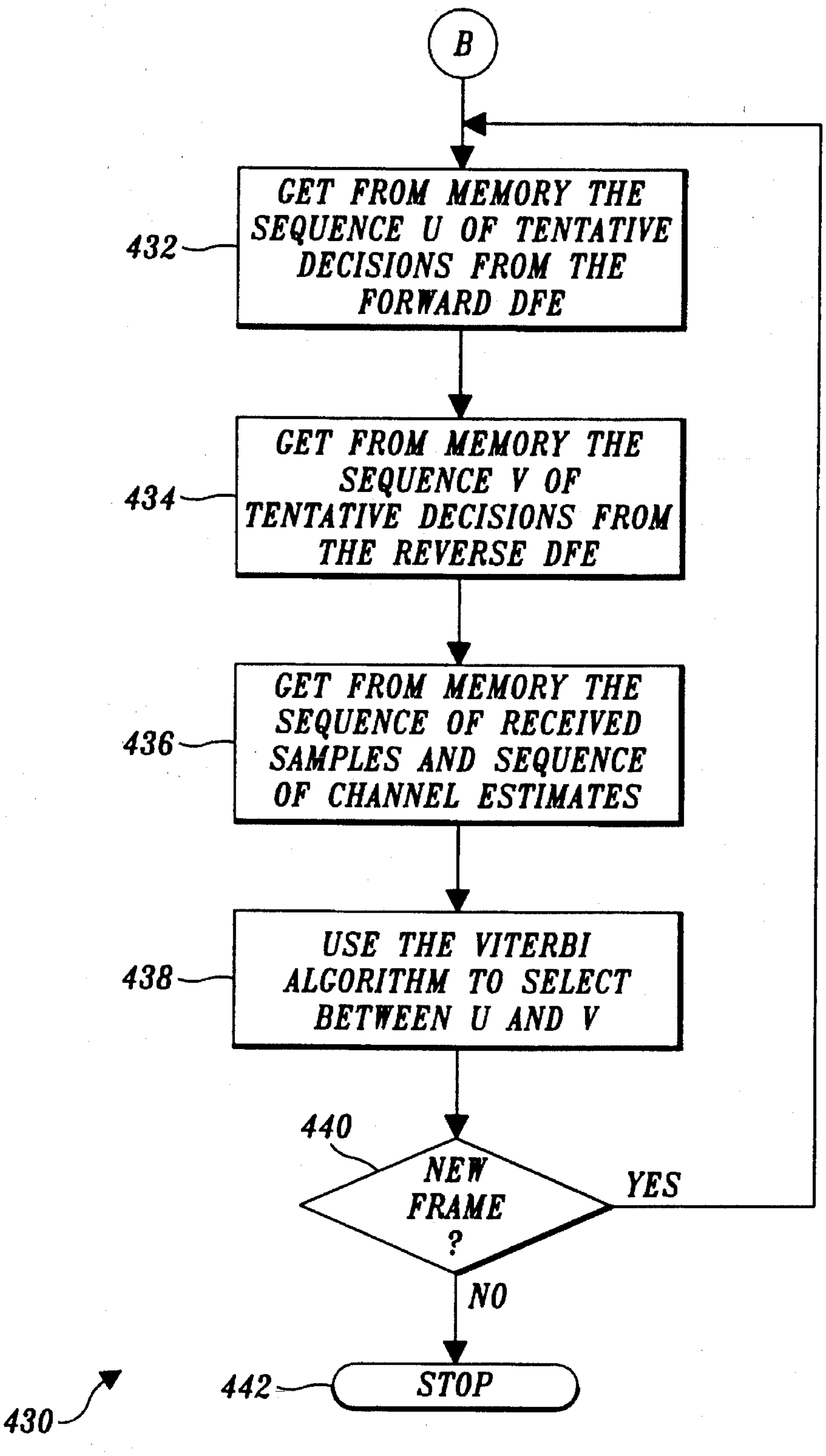
FIG. 20 is a flow chart showing the logical steps used in implementing a second stage Viterbi equalization to select between the forward and reverse equalization results.

Continuing with a flow chart 430 as shown in FIG. 20 at "B," a block 432 from the temporary buffer the sequence U of tentative decisions from the forward DFE. Similarly, in a block 434, the DSP recalls the temporarily buffered sequence V of tentative decisions made by the reverse DFE. In a block 436, the DSP obtains from its storage buffers the sequence of received samples and sequence of channel estimates so that in a block 438, the Viterbi algorithm can be applied to select between the sequences U and V to determine the decoded data. A decision block 440 determines if a new frame is then available to be processed, and if so, returns to block 432. Otherwise, the processing halts at a stop block 442.

Constant Envelope Modulation Equalization

Virtually all current simulcast communication systems use constant envelope modulation schemes; however, none of these systems employ adaptive equalization to mitigate the effect of multipath channel fading. Consequently, the baud rate for conventional constant envelope modulation simulcast communication systems is limited to about 3,000 baud. The same type of techniques used for adaptive equalization in a linear modulation system can also be employed to equalize the received RF signal in a constant envelope modulation system, wherein the input data is modulated by a transmitter configured as illustrated in FIG. 1C.

The primary benefit of using constant envelope modulation is that current simulcast communication systems already use transmitters employing this type of modulation. This RF equipment infrastructure would require only minor modifications to benefit from the adaptive equalization of the present invention. Essentially, only the receiving devices employed for constant envelope demodulation need to be modified to benefit from the higher data rate throughput that can be realized by applying adaptive equalization to the received signal. In contrast, although substantially higher throughput can be achieved with linear modulation schemes, it will be necessary to replace virtually all of the transmitters and receivers in use on a given simulcast communication system to obtain this benefit. It should be apparent that a constant envelope modulation scheme can thus be implemented with only a fraction of the cost of changing over to a faster linear modulation scheme.

While a number of preferred embodiments of the invention have been illustrated and described, it will be appreciated that various changes can be made therein without departing from the spirit and scope of the invention. Accordingly, it is not intended that the scope of the claims in any way be limited by the disclosure, but instead, be determined entirely by reference to the claims that follow.

The embodiments of the invention in which an exclusive property or privilege is claimed are defined as follows:

1. Apparatus for use in a radio receiver to process a demodulated signal, to recover data that was transmitted, comprising:

(a) a first stage equalizer that has an input coupled to the demodulated signal and two outputs, said first stage equalizer including a first decision feedback equalizer for processing the demodulated signal to produce a first equalized output signal by sequentially processing said demodulated signal in a forward direction relative to the time of signal reception by said receiver, said first stage equalizer further including a second decision feedback equalizer for processing the demodulated signal to produce a second equalized output signal by sequentially processing said demodulated signal in a reverse direction relative to said time of signal reception by said receiver equalized output signals, with one of the two outputs of said first stage equalizer providing the forward equalized output signal and the other of said outputs providing the reverse equalized output signal;

(b) a channel estimator that has an input coupled to receive the demodulated signal and an output that provides a channel impulse response estimate determined as a function of symbols comprising the demodulated signal, said channel estimator processing said channel impulse response estimate and provide a set of estimation coefficients;

(c) a second stage equalizer having inputs coupled to the outputs of the first stage equalizer and to the output of the channel estimator, and an output for providing decoded data, said second stage equalizer including most likely sequence estimation means responsive to said set of estimation coefficients, said most likely sequence estimation means selecting between the forward and reverse equalized output signals as a function of the channel impulse response estimate and decoding a selected one of the said forward and reverse equalized signals to produce a decoded data signal.

2. Apparatus for use in a radio receiver to process a demodulated signal for recovery of transmitted data, said apparatus comprising:

first and second decision feedback equalizers, each of said first and second decision feedback equalizers being connected for receiving the demodulated signal, said first decision feedback equalizer being responsive to a first set of estimation-coefficients, said first decision feedback equalizer sequentially processing said demodulated signal in a forward direction relative to the time of signal reception to provide a first equalized output signal; said second decision feedback equalizer being responsive to a second set of estimation coefficients, said second decision feedback equalizer sequentially processing said demodulated signal in a reverse direction relative to the time of reception to supply a second equalized output signal; and most likely sequence estimation means responsive to a third set of estimation coefficients for selecting as the output of said apparatus that one of said of first and second equalized output signals that is most likely to correspond to the data transmitted to said radio receiver by a plurality of simulcast transmitters; and a channel estimator for receiving said demodulated signal, said channel estimator processing said demodulated signal to periodically provide a channel impulse response estimate, said channel estimator for supplying said most likely sequence estimation means with updated sets of said third set of estimation coefficients that are determined from said periodically provided channel impulse response estimates.

3. The apparatus of claim 2, wherein said most likely sequence estimation means is a Viterbi decoder.

4. The apparatus of claim 3 wherein said channel estimator further provides updated sets of said first and second estimation coefficients to said first and second decision feedback equalizers, said updated sets of said first and second estimation coefficients being determined from said periodically provided channel impulse response estimates.

5. The apparatus of claim 2 wherein said most likely sequence estimation means implements an M-algorithm to provide a reduced complexity sequence search of said first and second equalized output signals.

6. The apparatus of claim 5 wherein said channel estimator further provides updated sets of said first and second estimation coefficients to said first and second decision feedback equalizers, said updated sets of said first and second estimation coefficients being determined from said periodically provided channel impulse response estimates.

7. The apparatus of claim 2 wherein the demodulated signal is representative of transmitted data that includes a plurality of data frames, each data frame including N data symbols, and wherein:

(a) said first decision feedback equalizer supplies said first equalized output signal in the form of a signal sequence that corresponds to [U]=((u(1),u(2), . . . ,u(N));

(b) said second decision feedback equalizer supplies said second equalized output signal in the form of a signal sequence that corresponds to [V]=(v(1),(v(2),. . . ,v(N)); and (c) said most likely sequence estimation means selects that one of said signal sequences [U] and [V] that minimizes the mean square error between the demodulated received signal r=. . . ,r(−1),r(0),r(1), . . . and first and second equalized output signals, said first equalized output signal being defined by $$\sum_{n=-m}^{m} u(k-n)f(k,n)$$

and said second equalized output signal being defined by $$\sum_{n=-m}^{m} v(k-n)f(k,n)$$

where m is a predetermined integer and f(k,n) is the estimated channel impulse response for the kth signal element of said demodulated received signal.

8. The apparatus of claim 7 wherein said channel estimator further provides updated sets of said first and second estimation coefficients to said first and second decision feedback equalizers, said updated sets of said first and second estimation coefficients being determined from said periodically provided channel impulse response estimates.

9. The apparatus of claim 2 wherein the demodulated signal is representative of transmitted data that includes a plurality of data frames, each data frame including N data symbols, and wherein:

(a) said first decision feedback equalizer supplies said first equalized output signal in the form of a signal sequence that corresponds to [U]=(u(1),u(2), . . . ,u(N));

(b) said second decision feedback equalizer supplies said second equalized output signal in the form of a signal sequence that corresponds to [V]=(v(1),v(2),. . . ,v(N)); and (c) said Viterbi decoder determines all possible N-length sequences for said signal sequences [U] and [V] and supplies as said signal that is most likely to correspond to the data transmitted to said receiver, the N-length sequence that exhibits the lowest value, M(W), where $$M(W)=\sum_{k=-a}^{N+b}\left|\left|\,r(k)-\sum_{n=-m}^{m}w(k-n)f(k,n)\,\right|\right|^2$$

where a, b and m are predetermined integers, r(k) represents the kth signal element of a periodic sequence of signals representing said demodulated received signal, and f(k,n) is the estimated channel impulse response for said kth signal element of said periodic sequence of signals.

10. The apparatus of claim 9 wherein said channel estimator further provides updated sets of said first and second estimation coefficients to said first and second decision feedback equalizers, said updated sets of said first and second estimation coefficients being determined from said periodically provided channel impulse response estimates.

11. The apparatus of claim 2 wherein said channel estimator further provides updated sets of said first and second estimation coefficients to said first and second decision feedback equalizers, said updated sets of said first and second estimation coefficients being determined from said periodically provided channel impulse response estimates.

12. The apparatus of claim 11, wherein said most likely sequence estimation means implements a reduced complexity Viterbi algorithm.

13. A signal processing method for recovering simulcast signal data that is transmitted to a receiver by a plurality of transmitters each of which synchronously transmit a modulated signal in which information is encoded as a plurality of signal flames with each signal frame including a preamble block, a data block that includes N data bits and a postamble block, said method being executable in a receiver that includes a data signal processor and associated memory, said method comprising:

demodulating the simulcast signal received by said receiver;

periodically sampling the demodulated signal to supply a signal sequence representative of said demodulated received signal;

processing said signal sequence representative of said demodulated received signal to supply a first signal sequence that is likely to correspond to a sequence of N data bits of the simulcast signal transmitted to said receiver, said processing of said signal sequence representative of said demodulated received signal comprising decision feedback equalization processing in a forward direction relative to the time of signal reception;

processing said signal sequence representative of said demodulated received signal to supply a second signal sequence that is likely to correspond to said sequence of N data bits of the simulcast signal transmitted to said receiver, said processing of said signal sequence representative of said demodulated received signal comprising decision feedback equalization processing in a reverse direction relative to the time of signal reception;

selecting one said first or second sequence of signals likely to correspond to said N data bits of said transmitted signal by determining which of said first and second sequences of signals is most likely to correspond to said N data bits, said step of selecting one of said first and second sequences of signals being performed in accordance with a Viterbi algorithm.

14. The signal processing method of claim 13 wherein said Viterbi algorithm is a reduced complexity Viterbi algorithm.

15. The signal processing method of claim 14 wherein said first signal sequence is of the form [U]=((u(1),u(2), . . . ,u(N)); said second signal sequence is of the form [V]=(v(1),v( 2), . . . ,v(N)); and said reduced complexity Viterbi algorithm determines all possible N-length sequences for said first and second signal sequences [U] and [V] and supplies as said signal that is most likely to correspond to the data transmitted to said receiver the N-length sequence that exhibits the lowest value, M(W), where $$M(W)=\sum_{k=-a}^{N+b}\left|\left|\,r(k)-\sum_{n=-m}^{m}w(k-n)f(k,n)\,\right|\right|^2$$

where a, b and m are predetermined integers, r(k) represents the kth signal element of a periodic sequence of signals representing said demodulated received signal, and f(k,n) is the estimated channel impulse response for said kth signal element of said periodic sequence of signals.

* * * * *

UNITED STATES PATENT AND TRADEMARK OFFICE

CERTIFICATE OF CORRECTION

PATENT NO. : 5,513,215

DATED : April 30, 1996

INVENTOR(S) : R.F. Marchetto et al.

It is certified that error appears in the above-indentified patent and that said Letters Patent is hereby corrected as shown below:

| **COLUMN** | **LINE** | |
|---|---|---|
| [56] (pg. 1, col. 1) | Refs. Cited U.S. Pat Docs | Insert --5,049,832 9/1991 J. Cavers 330/149-- |
| [56] (pg. 1, col. 1) | Refs. Cited Other Pubs. | Insert --*In the Matter of Mobile Telecommunication Technologies Corporation*, "Request for Pioneer's Preference," FCC, 11/12/91, pp.i-26.-- |
| [56] (pg. 1, col. 1) | Refs. Cited U.S. Pat Docs | Insert --*In the Matter of Mobile Telecommunication Technologies Corporation*, "Petition for Rulemaking," FCC, 11/12/91, pp. i-C21-- |
| [56] (pg. 1, col. 1) | Refs. Cited U.S. Pat Docs | Insert --Baum et al., "A Comparison of Nonlinear Equalization Methods for the U.S. Digital Cellular System," *ICC*, 1992, pp. 0291-0295.-- |
| [56] (pg. 1, col. 1) | Refs. Cited U.S. Pat Docs | Insert --Wan et al., "A Fractionally-Spaced Maximum-Likelihood Sequence Estimation Receiver in a Multipath Fading Environment," *IEEE*, 1992, pp. IV-689-IV-692.-- |

UNITED STATES PATENT AND TRADEMARK OFFICE

CERTIFICATE OF CORRECTION

PATENT NO. : 5,513,215

DATED : April 30, 1996

INVENTOR(S) : R.F. Marchetto et al.

It is certified that error appears in the above-indentified patent and that said Letters Patent is hereby corrected as shown below:

| COLUMN | LINE | |
|---|---|---|
| 15 | 1 | Before "is" first occurrence insert --r(k)-- |
| 15 | 1 | After "vector," insert --and-- |
| 29 (Claim 13, | 39 line 5) | "flames" should read --frames-- |
| 30 (Claim 15, | 28 lines 2-3) | "[U]=((u(1),u(2),...,u(n));" should read --[U]=(u(1),u(2),... ,u(N));-- |

Signed and Sealed this

Seventeenth Day of September, 1996

Attest:

BRUCE LEHMAN

*Attesting Officer*

*Commissioner of Patents and Trademarks*